(12) United States Patent
Tran et al.

(10) Patent No.: US 10,163,979 B2
(45) Date of Patent: *Dec. 25, 2018

(54) SELECTOR-RESISTIVE RANDOM ACCESS MEMORY CELL

(71) Applicant: GLOBALFOUNDRIES Singapore Pte. Ltd., Singapore (SG)

(72) Inventors: Xuan Anh Tran, Singapore (SG); Eng Huat Toh, Singapore (SG); Shyue Seng Tan, Singapore (SG); Yuan Sun, Singapore (SG); Elgin Kiok Boone Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 261 days.

This patent is subject to a terminal disclaimer.

(21) Appl. No.: 14/483,160

(22) Filed: Sep. 11, 2014

(65) Prior Publication Data

US 2016/0079310 A1    Mar. 17, 2016

(51) Int. Cl.
*H01L 27/24* (2006.01)
*H01L 45/00* (2006.01)
*H01L 27/22* (2006.01)

(52) U.S. Cl.
CPC ........ *H01L 27/2463* (2013.01); *H01L 27/226* (2013.01); *H01L 27/2445* (2013.01); *H01L 45/04* (2013.01); *H01L 45/06* (2013.01); *H01L 45/1233* (2013.01); *H01L 45/146* (2013.01); *H01L 45/1675* (2013.01)

(58) Field of Classification Search
CPC ............. H01L 27/2445; H01L 45/1233; H01L 27/2463; H01L 27/2481; H01L 45/04; H01L 45/06
See application file for complete search history.

(56) References Cited

U.S. PATENT DOCUMENTS 8,685,799 B1 * 4/2014 Tan ..................... H01L 27/2436
                                                          257/205
8,993,407 B2 * 3/2015 Tan ..................... H01L 45/1691
                                                          257/4

(Continued)

OTHER PUBLICATIONS

X.A. Tran et al., High Performance Unipolar AlOy/HfOx/Ni based RRAM Compatible with Si Diodes for 3D Application, 2011 Symposium on VLSI Technology Digest of Technical Papers, Aug. 15, 2011, pp. 44-45, IEEE.

(Continued)

*Primary Examiner* — Matthew Landau
*Assistant Examiner* — Mark Hatzilambrou
(74) *Attorney, Agent, or Firm* — Horizon IP Pte Ltd.

(57) ABSTRACT

Memory devices and manufacturing methods thereof are presented. A memory device a substrate and a memory cell having at least one selector and a storage element. The selector includes a well of a first polarity type disposed in the substrate, a region of a second polarity type disposed over the well and in the substrate, and first and second regions of the first polarity type disposed adjacent to the region of the second polarity type. The storage element includes a programmable resistive layer disposed on the region of the second polarity type and an electrode disposed over the programmable resistive layer.

20 Claims, 17 Drawing Sheets

(56) References Cited

U.S. PATENT DOCUMENTS

| | | | | |
|---|---|---|---|---|
| 2002/0008261 A1* | 1/2002 | Nishiyama | ........ | H01L 21/28562 |
| | | | | 257/288 |
| 2004/0248339 A1* | 12/2004 | Lung | ....................... | H01L 45/06 |
| | | | | 438/102 |
| 2006/0040462 A1* | 2/2006 | Wu | ....................... | G11C 11/412 |
| | | | | 438/424 |
| 2010/0237404 A1* | 9/2010 | Toba | ................. | H01L 21/28273 |
| | | | | 257/326 |
| 2013/0249017 A1* | 9/2013 | Kwon | ................. | H01L 27/0629 |
| | | | | 257/379 |
| 2013/0299764 A1* | 11/2013 | Tan | ..................... | H01L 29/4232 |
| | | | | 257/2 |

OTHER PUBLICATIONS

Chin Yu Mei et al., 28nm High-K Metal Gate RRAM with Fully Compatible CMOS Logic Processes, 2013 International Symposium on VLSI Technology, Systems, and Applications (VLSI-ISA), Jun. 25, 2013, pp. 1-2, IEEE.

* cited by examiner

700

700

SELECTOR-RESISTIVE RANDOM ACCESS MEMORY CELL

BACKGROUND

Floating gate type of non-volatile memory cell has achieved widespread adoptions in various IC devices due to their CMOS compatibility and low cost. However, current floating gate type of memory cell suffers from scaling issue, endurance/retention limit, high power consumption, complex structure, additional processing and high cost. In view of this, resistive-switching random access memory is attracting increasing interest as a potential candidate which overcomes the limitations of floating gate type of memory cells.

Currently, 1 transistor, 1 resistor (1T1R) resistive memory device is being implemented to form NOR/NAND structure. However, standard logic complementary metal oxide semiconductor (CMOS) transistor requires cell size which is larger than $30F^2$ (F~feature size) to provide sufficient driving current and offers only 1-bit per cell structure. Thus, there are issues and drawbacks associated with existing resistive switching type of random access memory and its manufacturing thereof. Accordingly, there remains a need for improved resistive-switching based memory devices with better drivability and requires smaller cell area as well as and manufacturing methods thereof.

SUMMARY

Embodiments generally relate to memory devices and manufacturing methods thereof. In one embodiment, a device is disclosed. The device includes a substrate and a memory cell having at least one selector and a storage element. The selector includes a well of a first polarity type disposed in the substrate, a region of a second polarity type disposed over the well and in the substrate, and first and second regions of the first polarity type disposed adjacent to the region of the second polarity type. The storage element includes a programmable resistive layer disposed on the region of the second polarity type and an electrode disposed over the programmable resistive layer.

In another embodiment, a device is presented. The device includes a substrate and a memory cell having first and second memory structures. The memory cell includes a well of a first polarity type disposed in the substrate and common to the first and second memory structures, first and second regions of a second polarity type disposed in the substrate over the well and are separated by a cavity, an isolation region disposed in the well and below the cavity, a programmable resistive layer which lines the cavity, and an electrode disposed over the programmable resistive layer and within the cavity. The memory cell also includes first and second layers of the first polarity type disposed over the first and second regions of the second polarity type and adjacent to first and second sides of the programmable resistive layer and electrode.

In another embodiment, a method of forming a device is presented. The method includes providing a substrate and forming a memory cell. A well of a first polarity type is formed in the substrate. At least a first region of a second polarity type is formed adjacent to the well. A patterned programmable resistive layer and electrode is provided on the substrate. First and second regions of the first polarity type are formed adjacent to the first region of the second polarity type and adjacent to the programmable resistive layer and electrode.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the present disclosure. In the following description, various embodiments of the present disclosure are described with reference to the following drawings, in which.

DETAILED DESCRIPTION

Embodiments generally relate to memory devices and manufacturing methods thereof. A memory device according to the present disclosure includes a resistive random access memory (RRAM) integrated with a selector structure, such as bipolar junction transistor (BJT). The memory device according to the present disclosure is built on or integrated with complementary metal oxide semiconductor (CMOS) processing. For illustration purpose, the first polarity type, for example, may be referred to as n-type while the second polarity type, for example, may be referred to as p-type. However, it is understood that modifications may be made such that the first polarity type, for example, may be referred to as p-type while the second polarity type, for example, may be referred to as n-type. The memory device according to the present disclosure offers a number of novel features vis-à-vis existing designs of memory devices. Firstly, a memory device according to the present disclosure is compact in size. Secondly, a memory device according to the present disclosure achieves better performance in terms of lower operating voltage, faster read/write operation, and better retention, endurance and scalability. Thirdly, a single-bit-per-cell (1-bit) or two-bits-per-cell (2-bits) structure may be achieved. Moreover, the process of manufacturing the memory device according to the present disclosure is compatible with CMOS technology.

Figure 1:
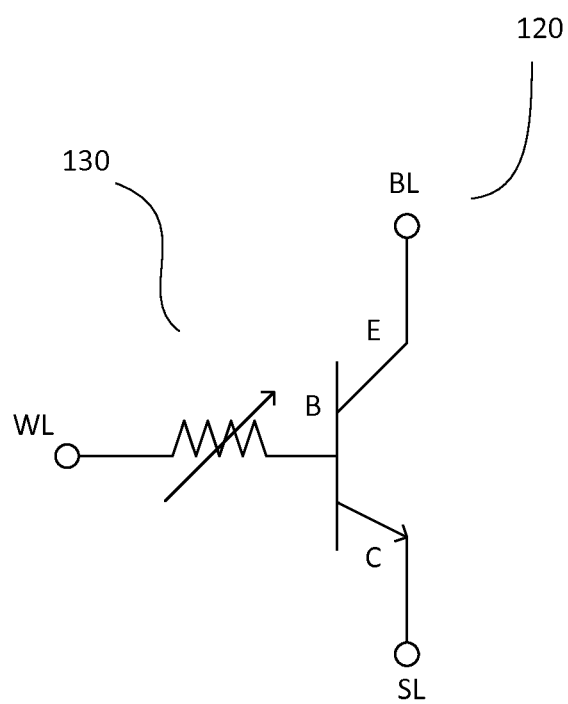
FIG. 1 shows a schematic view of an embodiment of a memory cell.

FIG. 1 shows a schematic view of an embodiment of a memory cell 100. The memory cell 100, in one embodiment, is a single-bit-per-cell structure. The memory cell includes a selector 120 and a storage element 130. The selector includes first, second and third terminals while the storage element includes first and second terminals. The selector, in one embodiment, is a BJT and the storage element, in one embodiment, is a resistive storage element, forming a bipolar junction transistor-resistive random access memory (BJT-RRAM) structure. In one embodiment, the first terminal or base (B) of the selector or BJT is directly coupled to the first terminal of the resistive storage element, the second terminal or emitter (E) of the BJT is coupled to a bit line (BL) and the third terminal or collector of the BJT is coupled to a source line (SL). The second terminal of the storage element is coupled to a word line (WL).

The resistive storage element includes a programmable resistive layer. The programmable resistive layer can be put in a first or a second state. The programmable resistive layer remains in a stable state until switched to the other state. In one embodiment, the programmable resistive layer is formed from a material which, when conductions paths or filaments are formed, can be broken (reset) or reformed (set) to be in a high or low resistive state. In one embodiment, when the conduction paths are broken or reset during a reset procedure, the programmable resistive layer is in the first or high resistive state which corresponds to a logic "0" stored; when the conduction paths are formed or reformed (set) in the programmable resistive layer, it is in the second or low resistive state which corresponds to a logic "1" stored. Other configurations of resistive states and data stored in the programmable resistive layer may also be useful.

As described, the selector is a BJT while the storage element is a resistive storage element, forming a BJT-RRAM structure. Other suitable emerging storage elements, such as but not limited to phase change random access memory (PCRAM) and magneto-resistive random access memory (MRAM) could also be applied with this structure.

Figure 2A:
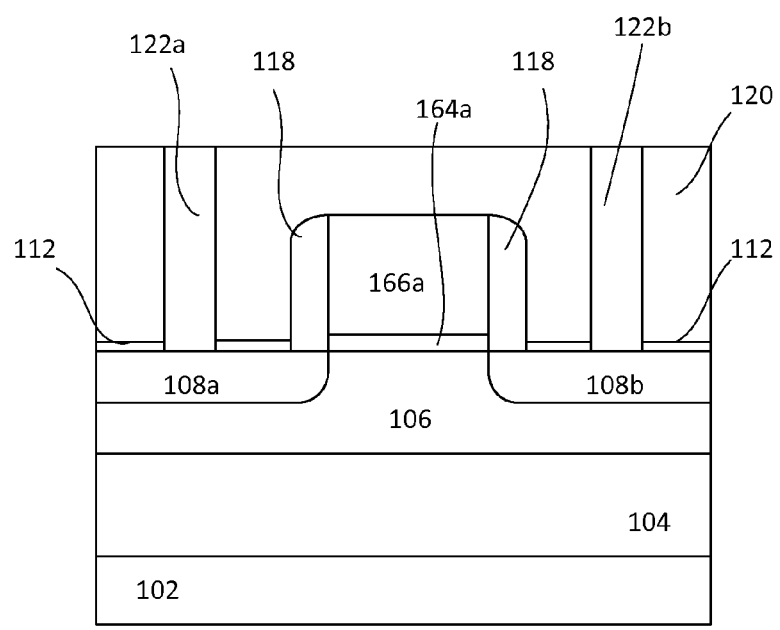
FIGS. 2a-2b show cross-sectional views of various embodiments of a portion of a device.

FIG. 2a shows cross-sectional view of an embodiment of a portion of a device 200a. The portion of the device includes a memory cell. In one embodiment, the memory cell includes a selector and a storage element as described in FIG. 1 above. The selector, in one embodiment, is a BJT and the storage element, in one embodiment, is a resistive storage element, forming a BJT-RRAM structure. The portion of the device 200a, in one embodiment, is a single-bit-per-cell structure. The portion of the device, as shown, includes a substrate 102. The substrate, for example, is a semiconductor substrate, such as a silicon substrate. In one embodiment, the substrate is a second polarity type doped substrate. For example, the substrate is lightly doped with second polarity type dopants. The second polarity type dopants, for example, include p-type dopants. Other suitable types of semiconductor substrates may also be useful.

The substrate includes a device region. The device region, in one embodiment, serves as a cell region for a memory cell. It is, however, understood that the substrate may include a plurality of device regions. In one embodiment, the cell region serves as a device region of a single-bit BJT-RRAM structure. Numerous cell regions may be provided in an array region to form a plurality of memory cells. Isolation regions (not shown) are formed in the substrate 102. The isolation region serves to isolate the cell region from other device regions (not shown) for other types of devices. The isolation region, for example, is a shallow trench isolation (STI) region. The STI region, for example, includes an isolation or dielectric material, such as silicon oxide, disposed in a trench which surrounds the device region. Other types of isolation regions may also be useful.

A well 104 of a first polarity type is disposed in the substrate 102. The first polarity type dopants, for example, are n-type dopants. The dopant concentration is about, for example, $1E11$-$1E12$ cm$^{-3}$. Other suitable types of dopants and dopant concentrations may also be useful. In one embodiment, the well 104 extends to a depth below the isolation regions (not shown). Other suitable depths may also be useful. In one embodiment, the first polarity type is n-type and the second polarity type is p-type. In such case, the well 104 is an n-type well or a deep n-type well (DNW), and the substrate 102 is a p-type substrate.

A region of second polarity type 106 is disposed over the well in the substrate. The region 106 includes lightly doped second polarity type dopants. Second polarity type dopants, such as p-type dopants which include B, $BF^2$, In or a combination thereof, are implanted at a dose of about $1E12$-$1E14$ atom/cm$^2$ with an energy of about 50-300 keV into the substrate to form the region 106. Other suitable depth dimensions and dopant concentrations may also be useful, depending on technology node.

As described, the storage element includes a resistive storage element. In one embodiment, the resistive storage element is disposed directly on the substrate 102. The resistive storage element includes a programmable resistive layer disposed directly on the substrate and a top electrode disposed on top of the programmable resistive layer. In some embodiments, the region of the second polarity type 106 may serve as a bottom electrode of the resistive storage element instead of using other types of metals for the bottom electrode. As shown in FIG. 2a, the programmable resistive layer 164a is disposed directly on the region of the second polarity type 106. Depending on the CMOS process, the programmable resistive layer 164a, for example, may be the same layer used for forming gate dielectric of other devices. The programmable resistive layer 164a, for example, includes a programmable resistive material that creates conduction paths or filaments when subjected to a forming procedure. Generally, the forming procedure is performed on a new device that has not yet been operated. During programming operation, the filaments can be reset or broken by subjecting the programmable resistive material to a reset procedure or condition; the filaments can be set or re-formed by subjecting the programmable resistive material to a set procedure or condition as will be described later. Once set or reset, the state of the storage element is stable until reset or set.

The programmable resistive layer, in one embodiment, includes a transitional metal oxide, such as but not limited to nickel oxide ($NiO_2$), hafnium oxide ($HfO_2$), zirconium oxide ($ZrO_2$), aluminum oxide ($AlO_2$), titanium oxide ($TiO_2$), tantalum oxide ($Ta_2O_5$), tungsten oxide (WOx), titanium oxynitride (TiON), germanium oxide (GeO), silicon oxide ($SiO_2$) or tin oxide ($SnO_2$). Other suitable types of programmable resistive materials may also be useful. The thickness and length of the programmable resistive layer 164a, for example, may be about 2-5 nm and 10-20 nm respectively. Other suitable thicknesses and lengths may also be useful.

The top electrode 166a, as shown, is disposed on top of the programmable resistive layer 164a. The electrode may serve as a top electrode of the memory cell. The electrode is coupled to a contact (not shown). The electrode, for example, is the same layer used for forming gate electrode of other devices, such as but not limited to I/O and core devices, disposed on the same substrate. The electrode, for example, includes metal. Various suitable types of metal, such as Ru, W, Pt, TiN, Ti, Zr, TaN, Si or Al, can be used. Other suitable types of electrode materials, such as metal or metal nitride, are also useful.

Referring to FIG. 2a, first and second regions of first polarity type 108a/108b are disposed in the substrate adjacent to first and second sides of the storage element. The first polarity type dopants, for example, include n-type dopants. The dopant concentration of the regions 108a/108b may be about 1E13-1E15 cm$^{-3}$. First polarity type dopants, such as n type dopants which include phosphorus (P), arsenic (As), or a combination thereof, are implanted at a dose of about 1E13-1E15 atoms/cm-2 and at energy of about 2-20 keV into the substrate to form the regions 108a/108b. Other suitable depth dimensions and dopant concentrations may also be useful, depending on the depth of the region 106 and types of dopants. Lightly doped regions (not shown) may also be disposed in the substrate adjacent to sides of the top electrode and to a depth above the depth of the regions 108a/108b.

In an alternative embodiment, the dopant concentrations for the regions 108a and 108b may be different from each other. For example, the second region 108b in the substrate adjacent to second side of the electrode as shown in FIG. 2a includes a heavily doped region. In this case, the dopant concentration of the heavily doped second region 108b may be about $10^{20}$ cm$^{-3}$. Other suitable dopant concentrations may also be useful.

Sidewall spacers 118 may be disposed over the first and second sidewalls of the programmable resistive layer and electrode. The sidewall spacers, for example, may be silicon nitride. Other suitable types of dielectric material, such as silicon oxide or silicon oxynitride may also be used. The thickness of the sidewall spacers may be about, for example, 5 nm. Other suitable thickness ranges may also be useful.

In one embodiment, the first and second regions of the first polarity type 108a and 108b are disposed in the substrate and have top surfaces substantially coplanar with top surface of the region of the second polarity type 106 or substrate. As shown, the storage element is disposed on top of the region of the second polarity type or the substrate.

The portion of the device 200a further includes an inter-level dielectric (ILD) layer 120 disposed over the substrate and the storage element. The ILD layer, for example, includes an oxide layer. Other suitable types of dielectric material may also be used. Silicide contacts 112 may be disposed between the ILD layer 120 and the first and second regions of the first polarity type 108a/108b. As described earlier, the portion of the device is a single-bit-per-BJT RRAM cell integrated with CMOS processing. The region of the second polarity type 106 serves as the base while the first and second regions of the first polarity type 108a and 108b serve as the collector and emitter of the BJT. The region of the second polarity type 106 also serves as the bottom electrode of the RRAM cell. The electrode 166a is configured to function as the top electrode and a word line of the device. The ILD layer 120 includes a first contact 122a coupling the first region of the first polarity type 108a or the collector of the BJT to a source line (SL) of the device. The ILD layer 120 also includes a second contact 122b coupling the second region of the first polarity type 108b or emitter of the BJT to a bit line (BL) of the device. The ILD layer 120 also includes a contact (not shown) which is coupled to the electrode (166a) or word line (WL) of the device.

Figure 2B:
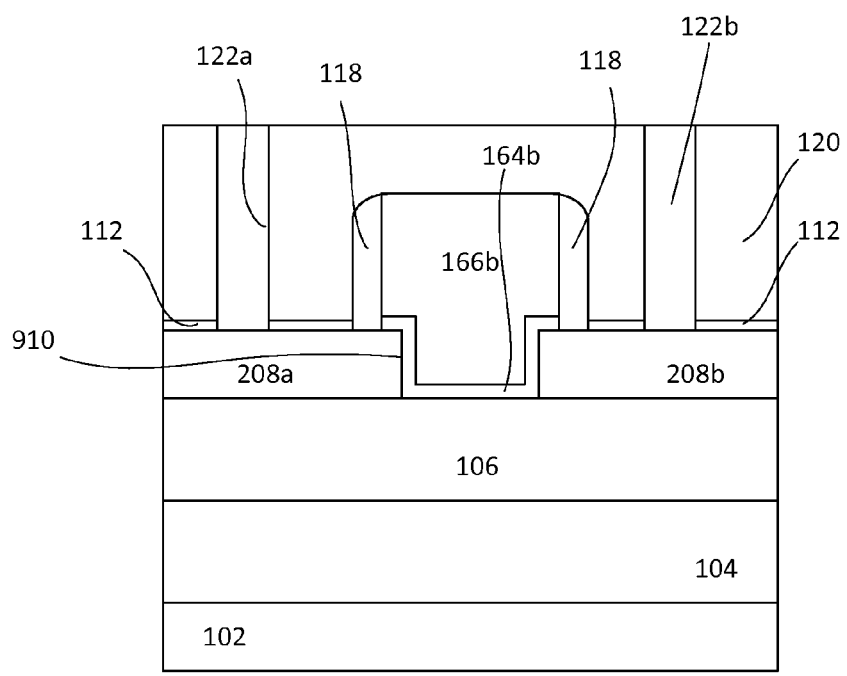

FIG. 2b shows a cross-sectional view of a portion of a device 200b which varies from the portion of the device 200a of FIG. 2a in accordance with another embodiment of the present disclosure. As most components of the device 200b are identical or at least similar to corresponding components of the device 200a, in the interest of brevity, the description below focuses on the differences between the device 200b and the device 200a.

Referring to FIG. 2b, the first and second regions of the first polarity type 208a and 208b are disposed over or on top of the region of the second polarity type 106 or substrate. As shown, the regions 208a and 208b are separated by a cavity 910. The regions 208a and 208b include the same dopants and dopant concentrations as the regions 108a and 108b described above. In one embodiment, portion of the electrode 166b and the programmable resistive layer 164b of the memory cell are disposed within the cavity and extend below the top surfaces of the first and second regions of the first polarity type. For example, a portion of the programmable resistive layer 164b lines the cavity and a portion of the electrode is disposed within the cavity while remaining portions of the programmable resistive layer and electrode are disposed on top surfaces of the first and second regions of the first polarity type.

To access the memory cell, appropriate voltages should be applied to the WL and BL respectively. The programmable resistive layer can be put in a first or a second state, depending on the voltage which is applied to the WL. The programmable resistive layer remains in a stable state until switched to the other state. In one embodiment, the programmable resistive layer is formed from a material which, when conductions paths or filaments are formed, can be broken (reset) or reformed (set) to be in a high or low resistive state. In one embodiment, when the conduction paths are broken or reset during a reset procedure, the programmable resistive layer is in the first or high resistive state which corresponds to a logic "0" stored; when the conduction paths are formed or reformed (set) in the programmable resistive layer, it is in the second or low resistive state which corresponds to a logic "1" stored. Other configurations of resistive states and data stored in the programmable resistive layer may also be useful.

Figure 3:
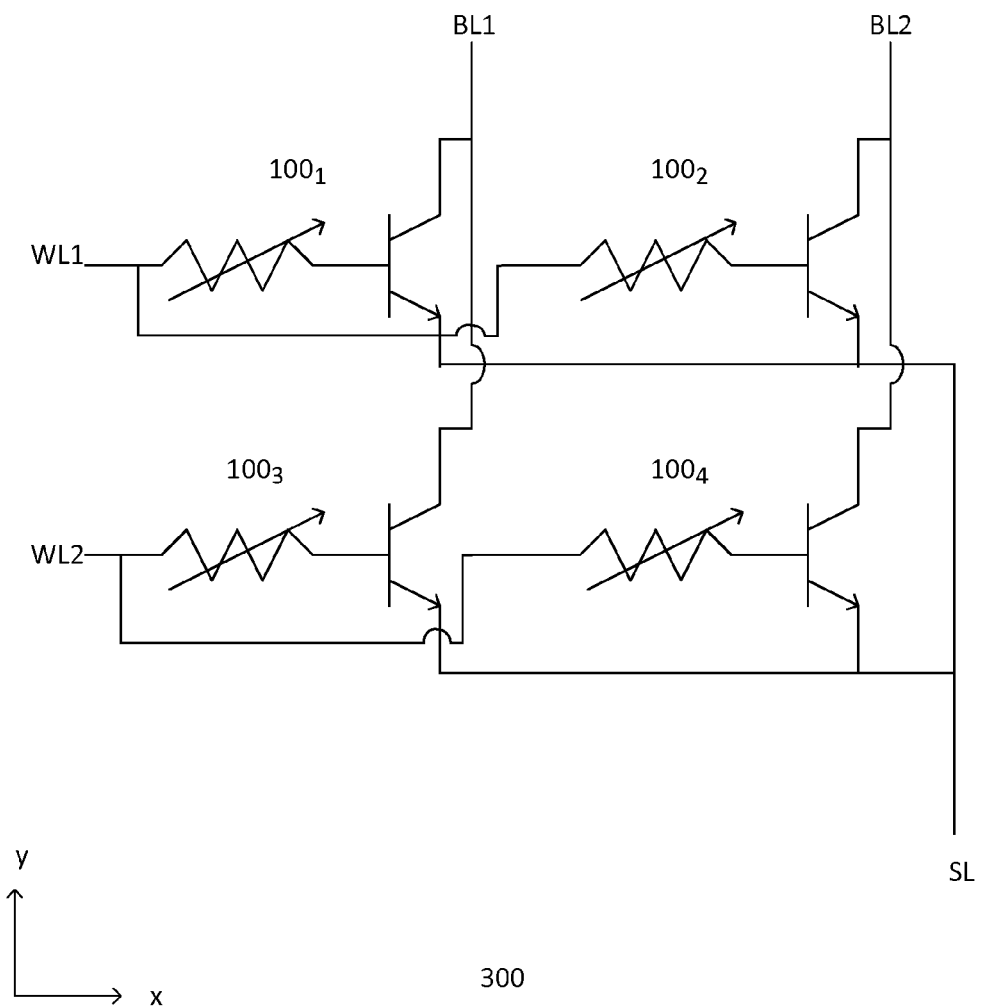
FIG. 3 shows an embodiment of a memory array.

A plurality of the memory cells as described in any of the embodiments shown in FIGS. 2a-2b above may be interconnected by word lines and bit lines to form a memory array 300. As described, the memory cell includes contacts coupled to word line and a bit line. FIG. 3 shows a schematic diagram of an embodiment of an array 300 of memory cells. A portion of the array is shown with, for example, four memory cells (100$_1$, 100$_2$, 100$_3$ and 100$_4$), such as those described in FIG. 1. For example, the memory cell is a single-bit-per-cell structure. Common elements may not be described or described in detail. The plurality of memory cells of the array is arranged in first (x) and second (y) directions. The first direction, for example, is in the column direction and the second direction is in the row direction. For example, the array has x columns and y rows of memory cells. The column direction is in the BL direction and the row direction is in the WL direction. A column of memory cells shares a common BL. A row of memory cells has a common WL. The memory cells share a common SL. As shown in FIG. 3, the memory cells are interconnected to form two columns connected by BLs (BL1 and BL2), two rows of memory cells connected by WLs (WL1 and WL2) and the memory cells are connected to a common SL, forming a NOR structure array. For example, the portion is a 2×2 portion of a NOR structure array. It is understood that the array may include numerous rows and columns.

A memory cell may be accessed by applying appropriate voltages to the terminals. By applying appropriate voltages to the WLs, SL and BLs, a bit or multiple bits of the memory array may be selected for accessing. A memory access may include a program, read or erase operation. Table 1 below shows various signals applied to the terminals of a memory array of selected and non-selected cells for the different memory operations:

| Terminals | Operations | Read | Program | Erase |
|---|---|---|---|---|
| WL | Sel. | Vread at Base | VSet | VReset |
|    | Non-Sel. | Floating | Floating | Floating |
| SL | Sel. | Ground | Floating | Floating |
|    | Non-Sel. | Ground | Floating | Floating |
| BL | Sel. | Vread at Emitter | Ground | Ground |
|    | Non-Sel. | Floating | Floating | Floating |

It is understood that various suitable types of voltage values may be applied to the terminals of the memory array, depending on the technology node.

The embodiments as described in FIGS. 1, 2a-2b and 3 include a storage element, for example, a RRAM, disposed directly on a selector, such as BJT, embedded in the substrate. Thus, the memory cell as described is compact in size. Compared to conventional floating gate type of memory cells, the embodiment as described in FIGS. 2a-2b which works as resistive memory with filaments formation requires lower operating voltage, leading to significant power reduction. Further, the memory cell having the programmable resistive layer disposed directly on the substrate as described in FIGS. 1, 2a-2b and 3 achieves better performance in terms of faster read/write operation, better retention, endurance and scalability. In addition, for the read operation, current is read at the BJT selector only. As such, better retention can be achieved through the embodiments described above. Furthermore, such configuration also reduces costs of the bottom electrode which generally uses metal material which is relatively expensive.

Figure 4:
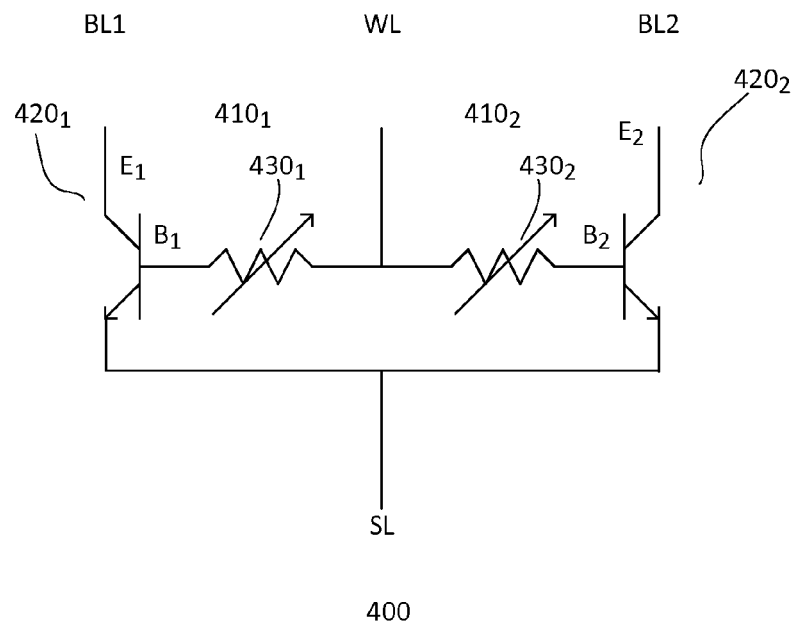
FIG. 4 shows a schematic view of another embodiment of a memory cell.

FIG. 4 shows a schematic view of an embodiment of a memory cell 400. The memory cell 400, in one embodiment, is a two-bits-per-cell structure. The memory cell includes a first memory structure $410_1$ and a second memory structure $410_2$ in a single cell area. In FIG. 4, some reference numerals may include a subscript. The subscript indicates which memory structure of the memory cell that the element is associated. For example, a reference numeral with a subscript 1 indicates that the element is associated with the first memory structure of the memory cell; a reference numeral with a subscript 2 indicates that the element is associated with the second memory structure of the memory cell. In some instances, the description may refer to elements generally without including the subscript.

Each of the first and second memory structures includes a selector 420 and a storage element 430. The selector includes first, second and third terminals while the storage element includes first and second terminals. The selector, in one embodiment, is a BJT and the storage element, in one embodiment, is a resistive storage element, forming a BJT-RRAM structure. Referring to FIG. 4, in one embodiment, the first terminal or base (B) of the selector or BJT is directly coupled to the first terminal of the resistive storage element. The second terminal or emitter (E) of the first BJT-RRAM structure $410_1$ is coupled to a first bit line (BL1) while the second terminal or emitter of the second BJT-RRAM structure $410_2$ is coupled to a second bit line (BL2). The third terminals or collectors of the BJTs are coupled to a source line (SL) while the second terminals of the storage elements are coupled to a word line (WL). In one embodiment, the SL and WL are common to the first and second BJT-RRAM structures.

As described, the selector is a BJT while the storage element is a resistive storage element, forming a BJT-RRAM structure. Other suitable types of selector and storage elements may also be useful. For example, other suitable emerging storage elements, such as but not limited to PCRAM and MRAM may also be useful.

Figure 5:
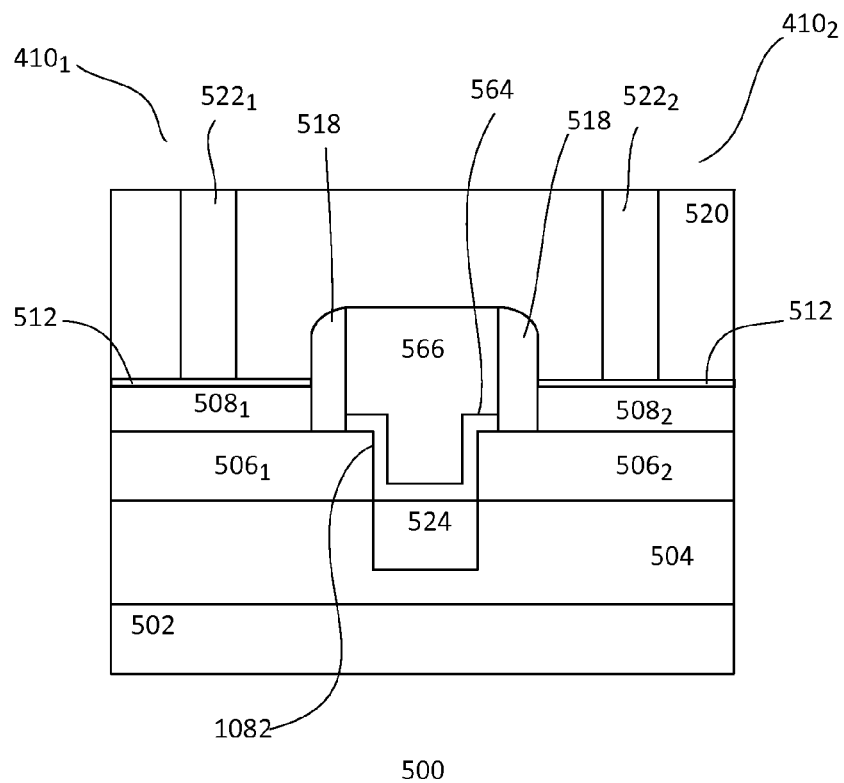
FIG. 5 shows cross-sectional view of another embodiment of a portion of a device.

FIG. 5 shows a cross-sectional view of an embodiment of a portion of a device 500. The portion of the device includes a memory cell. The device 500 may include similar features as already described in FIGS. 2a-2b. Thus, similar features will not be described or described in detail.

In one embodiment, the portion of the device 500 includes a two-bits-per-cell structure as that described in FIG. 4. The portion of the device 500 includes a first memory structure $410_1$ and a second memory structure $410_2$ disposed in a single cell area. Each of the first and second memory structures includes a selector and a storage element. The selector, in one embodiment, is a BJT and the storage element, in one embodiment, is a resistive storage element, forming a BJT-RRAM structure.

The portion of the device 500 includes a well of a first polarity type 504 disposed in a substrate 502 of a second polarity type. In one embodiment, the device includes a first fin structure correspond to a first region $506_1$ of the second polarity type disposed over the well 504, a second fin structure corresponds to a second region $506_2$ of the second polarity type disposed over the well 504, and a cavity 1082 separating the first and second regions $506_1$ and $506_2$ of the second polarity. The first and second fin structures and the well, for example, are part of the substrate. The dopant concentrations for the well of the first polarity type 504 and for the first and second regions of the second polarity type $506_1$ and $506_2$ are the same as that described for the well 104 and region of the second polarity type 106 as described in FIG. 2a-2b above.

In one embodiment, portion of an electrode 566 and a programmable resistive layer 564 of the memory cell are disposed within the cavity and extend below the top surfaces of the first and second regions of the second polarity type $506_1$ and $506_2$. For example, a portion of the programmable resistive layer 564 lines the cavity and a portion of the electrode 566 is disposed within the cavity while remaining portions of the programmable resistive layer and electrode are disposed on top surfaces of the first and second regions of the second polarity type. Spacers 518 are disposed on first and second sides of the programmable resistive layer and electrode. The materials for the programmable resistive layer, electrode and spacers are the same as that described in FIGS. 2a-2b. The portion of the device 500 further includes a STI region 524 disposed in the well 504. As shown in FIG. 5, the STI region 524 is directly below the portions of the programmable resistive layer and electrode in the cavity.

The portion of the device 500, in one embodiment, includes a first layer of the first polarity type $508_1$ disposed on the first region of the second polarity type $506_1$ of the first fin structure and adjacent a first side of the electrode. The portion of the device 500, in one embodiment, includes a second layer of the first polarity type $508_2$ disposed on the second region of the second polarity type $506_2$ of the second fin structure and adjacent a second side of the electrode which is opposite the first side of the electrode. The first and second layers of the first polarity type $508_1$ and $508_2$ include material and dopant concentration of the second region or layer of the first polarity type 108b as that already described in FIGS. 2a-2b above. For example, the first and second layers $508_1$ and $508_2$ are heavily doped with first polarity type dopants.

The portion of the device 500 further includes an ILD layer 520 disposed over the first and second layers of the first polarity type 508$_1$/508$_2$ and the electrode. Silicide contacts 512 may be formed between the ILD layer 520 and the first and second layers of the first polarity type 508$_1$/508$_2$. As described earlier, the portion of the device is a 2-bits-per-cell structure integrated with CMOS processing. The first and second layers of the first polarity type 508$_1$/508$_2$ serve as the emitter of the respective first and second BJT-RRAM structures. Further, the first and second regions of the second polarity type 506$_1$/506$_2$ serve as the base of the respective first and second BJT-RRAM structures while the well 504 serves as the common collector of the respective first and second BJT-RRAM structures. The well also functions as the common source line of the device while the electrode 566 is configured to function as a common word line of the device. The ILD layer 120 includes a first contact 522$_1$ coupling the first layer of the first polarity type 508$_1$ or the emitter of the first BJT-RRAM structure to a first bit line (BL1) of the device. The ILD layer 520 also includes a second contact 522$_2$ coupling the second layer of the first polarity type 508$_2$ or emitter of the second BJT-RRAM structure to a second bit line (BL2) of the device. The ILD layer 120 also includes a contact (not shown) which is coupled to the electrode (566) or common word line (WL) of the device.

Figure 6:
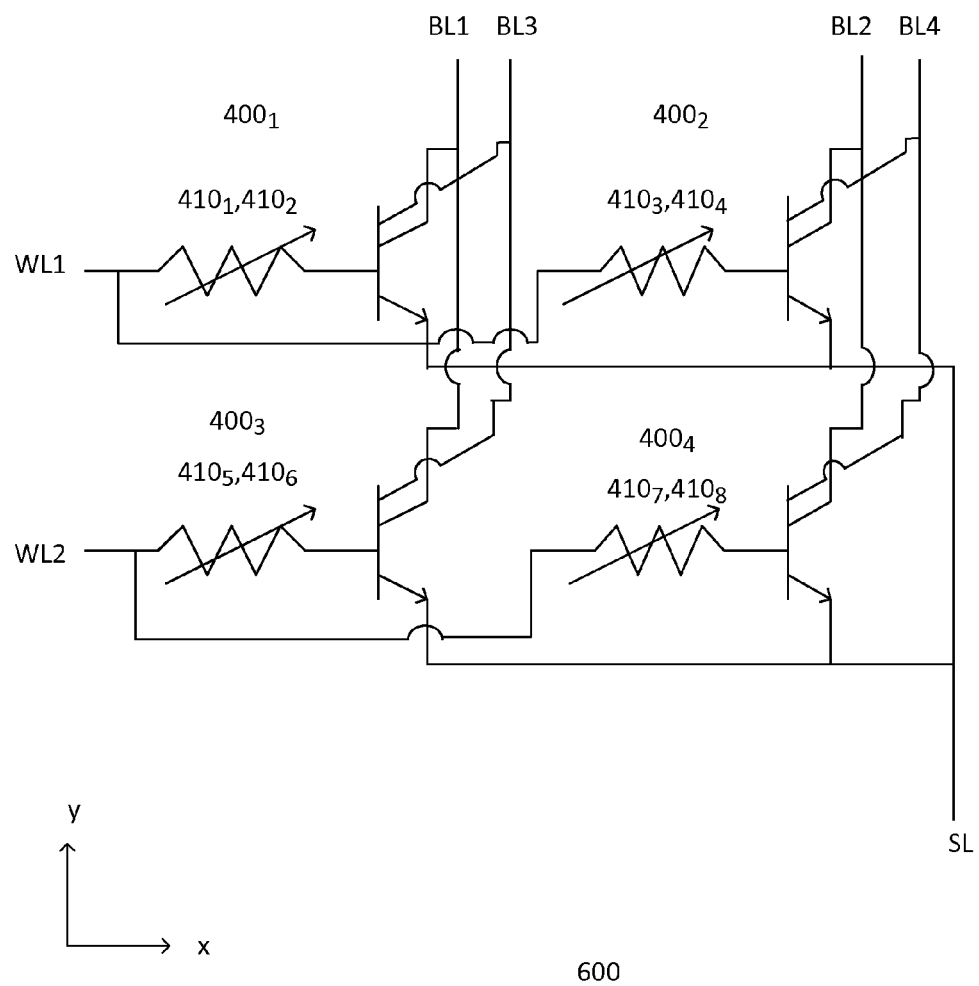
FIG. 6 shows another embodiment of a memory array.

A plurality of the memory cells as described in the embodiments shown in FIGS. 4-5 above may be interconnected by word lines and bit lines to form a memory array 600. As described, the first and second BJT-RRAM structures of the memory cell include contacts coupled to word line and bit lines. FIG. 6 shows a schematic diagram of an embodiment of an array 600 of memory cells. A portion of the array is shown with, for example, four memory cells (400$_1$, 400$_2$, 400$_3$ and 400$_4$), such as those described in FIG. 4. For example, the memory cell is a 2-bits-per-cell structure. Each of the memory cells (400$_1$, 400$_2$, 400$_3$ and 400$_4$) includes first and second BJT-RRAM structures (410$_{1-2}$; 410$_{3-4}$; 410$_{5-6}$ and 410$_{7-8}$). Common elements may not be described or described in detail. The plurality of memory cells of the array is arranged in first (x) and second (y) directions. The first direction, for example, is in the column direction and the second direction is in the row direction. For example, the array has x columns and y rows of memory cells. The column direction is in the BL direction and the row direction is in the WL direction. A column of BJT-RRAM structures shares a common BL. For example, the first BJT-RRAM structures of the first and third memory cells disposed on the same column share a common first bit line (BL1) while the second BJT-RRAM structures of the first and third memory cells disposed on the same column share a common third bit line (BL3); the first BJT-RRAM structures of the second and fourth memory cells disposed on the same column share a common second bit line (BL2) while the second BJT-RRAM structures of the second and fourth memory cells disposed on the same column share a common fourth bit line (BL4). A row of memory cells has a common WL. The memory cells share a common SL. As shown in FIG. 6, the memory cells are interconnected by BLs (BL1, BL2, BL3 and BL4), two rows of memory cells connected by WLs (WL1 and WL2) and the memory cells are connected to a common SL, forming a NOR structure array. It is understood that the array may include numerous rows and columns.

A BJT-RRAM structure may be accessed by applying appropriate voltages to the terminals. By applying appropriate voltages to the WLs, SL and BLs, a bit or multiple bits of the memory array may be selected for accessing. A memory access may include a program, read or erase operation. The operation of the memory cell 400 is similar to the operation of the memory cell 100 and the example voltage values as described in Table 1 above may be employed to the memory cell 400. Thus, such details will not be described.

The embodiments as described in FIGS. 4, 5 and 6 may have similar or the same advantages as the embodiments as described in FIGS. 1, 2a-2b and 3 above. Thus, similar or the same advantages will not be described. Further, as shown in FIG. 5, the portion of the device 500 includes an STI region 524 which isolates the first and second BJT-RRAM structures. For example, the STI region allows the programmable resistive layer to be separated into two regions which enable a two-bits-per-cell design to be achieved. The embodiment, as shown in FIG. 5, includes two different bits in a single cell structure. This helps achieve smaller cell size and with lower cost per bit.

Figure 7A:
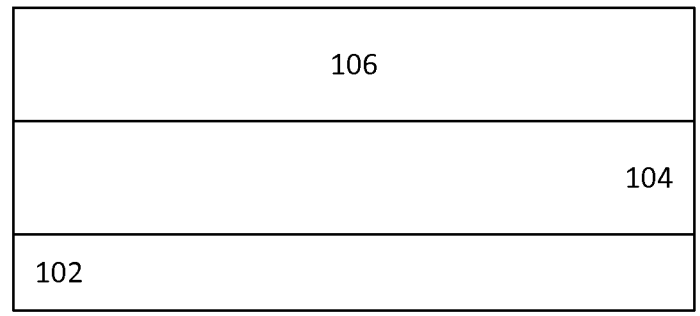
FIGS. 7a-7f show cross-sectional views of an embodiment of a process for forming a device.

FIGS. 7a-7j show cross-sectional views of an embodiment of a process 700 for forming a device. In one embodiment, the process 700 forms the portion of the device 200a of FIG. 2a. The portion of the device 200 includes a single-bit-per-cell structure. In forming the device 200a, the process 700 forms a storage element with embedded selector using CMOS processing. In one embodiment, the process forms a RRAM structure with embedded BJT as the selector. Referring to FIG. 7a, a substrate 102 is provided. The substrate, for example, is a semiconductor substrate, such as a silicon substrate. In one embodiment, the substrate is a second polarity type doped substrate. For example, the substrate is lightly doped with second polarity type dopants. The second polarity type dopants, for example, include p-type dopants. Other suitable types of semiconductor substrates or undoped semiconductor substrates may also be useful.

The substrate includes a device region. The device region, in one embodiment, serves as a cell region for a memory cell. It is, however, understood that the substrate may include a plurality of device regions. In one embodiment, the cell region serves as a device region of a RRAM with the embedded selector. For example, the cell region serves as a device region for a single-bit BJT-RRAM structure. Numerous cell regions may be provided in an array region to form a plurality of memory cells. Isolation regions (not shown) are formed in the substrate 102. The isolation region serves to isolate the cell region from other device regions (not shown) for other types of devices. The isolation region, for example, is a shallow trench isolation (STI) region. Other types of isolation regions may also be useful. The STI region, for example, includes an isolation or dielectric material, such as silicon oxide, disposed in a trench. The STI regions (not shown) may be formed using various suitable techniques.

The process continues to form a well 104. The well, in one embodiment, includes first polarity type dopants. The first polarity type dopants, for example, are n-type dopants. The dopant concentration is about, for example, 1E11-1E12 cm$^{-3}$. Other suitable types of dopants and dopant concentrations may also be useful. In one embodiment, the well 104 extends to a depth below the isolation regions (not shown). Other suitable depths may also be useful. The well 104, for example, may be part of the substrate. For example, dopants are implanted into the substrate to form the well. Providing any suitable implant energies and doses may also be useful. The implant parameters, such as energy and dose, are tailored to produce the well at the desired location and have the desired effect. By adjusting the energy and dose of the implant, the location and depth of the well can be controlled. In another embodiment, the well may be formed by epitaxial technique and in-situ doped with first polarity type dopants. Other suitable techniques for providing the well may also be useful.

In one embodiment, the process continues to form a region of second polarity type 106 over the well in the substrate as shown in FIG. 7a. The region 106 includes lightly doped second polarity type dopants. To form the region 106, second polarity type dopants, such as p-type dopants, are implanted into the substrate. An implant mask which exposes the device region may be provided to perform the implant. The implant mask, for example, may be a photoresist layer. Other suitable types of implant masks may also be useful. Second polarity type dopants, such as p-type dopants which include B, $BF^2$, In or a combination thereof, are implanted at a dose of about 1E12-1E14 atom/cm$^2$ with an energy of about 50-300 keV into the substrate to form the region 106. Alternatively, multiple second polarity type implants with different energy depths may be employed to form the region 106. Providing any suitable implant energies and doses may also be useful, depending on technology node. The implant parameters, such as energy and dose, are tailored to produce the region of second polarity type at the desired location and have the desired effect. By adjusting the energy and dose of the implant, the location and depth of the region of the second polarity type can be controlled. In an alternate embodiment, the region 106 may be formed by epitaxial technique and in-situ doped with second polarity type dopants. Other techniques for providing the region of the second polarity type may also be useful.

The process continues to form the storage element. In one embodiment, a programmable resistive layer 564 is provided on the top surface of the substrate or the region of the second polarity type. Depending on the CMOS process, the programmable resistive layer 564, for example, may be the same layer used for forming gate dielectric of other devices. The programmable resistive layer, in one embodiment, includes a transitional metal oxide, such as but not limited to nickel oxide ($NiO_2$), hafnium oxide ($HfO_2$), zirconium oxide ($ZrO_2$), aluminum oxide ($AlO_2$), titanium oxide ($TiO_2$), tantalum oxide ($Ta_2O_5$), tungsten oxide (WOx), titanium oxynitride (TiON), germanium oxide (GeO), silicon oxide ($SiO_2$) or tin oxide ($SnO_2$). Other types of programmable resistive materials may also be useful. The programmable resistive layer is formed by, for example, thermal oxidation, chemical vapor deposition (CVD) or atomic layer deposition (ALD). The thickness of the programmable resistive layer, for example, may be about 3-5 nm.

An electrode layer 566, as shown, is formed on top of the programmable resistive layer 564. The electrode layer 566, for example, may be the same layer used for forming gate electrode of other devices, such as but not limited to I/O and core devices, disposed on the same substrate. Various suitable types of metal, such as Ru, W, Pt, TiN, Ti, Zr, TaN, Si or Al, can be used. Other suitable types of electrode materials, such as polysilicon, metal or metal nitride, are also useful. The thickness of the electrode layer may be about, for example, 50-500 nm. The electrode layer, for example, can be formed by CVD. Other suitable techniques for forming and other suitable thickness dimensions for the programmable resistive and electrode layers may also be useful.

Figure 7B:
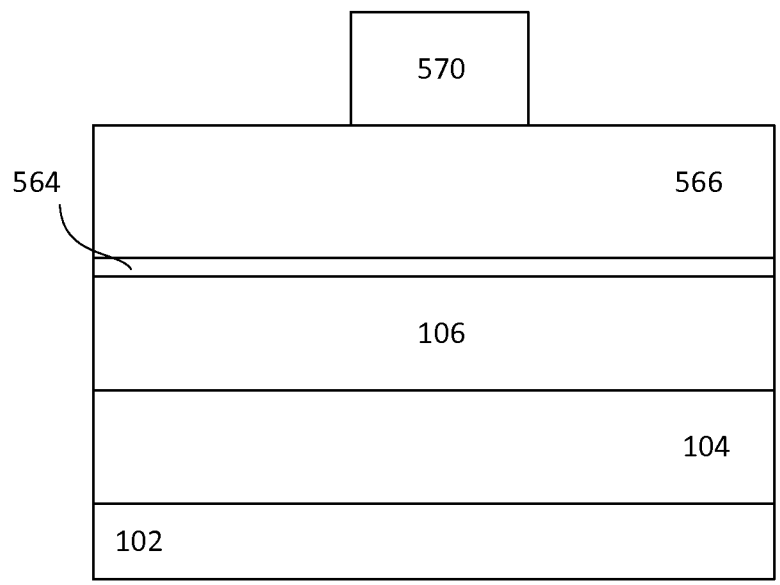

Referring to FIG. 7b, the layers are processed to form a patterned programmable resistive layer 164 and electrode 166. The patterning of the layers can be achieved, for example, by mask and etch techniques. For example, a patterned photoresist mask 570 may be used as an etch mask for an anisotropic etch, such as reactive ion etch (RIE). To improve lithographic resolution, an anti-reflective coating (ARC) can be provided beneath the photoresist. Other techniques for patterning the layers to form the gate may also be useful. After patterning the layers, the mask, including the ARC layer, may be removed.

Figure 7C:
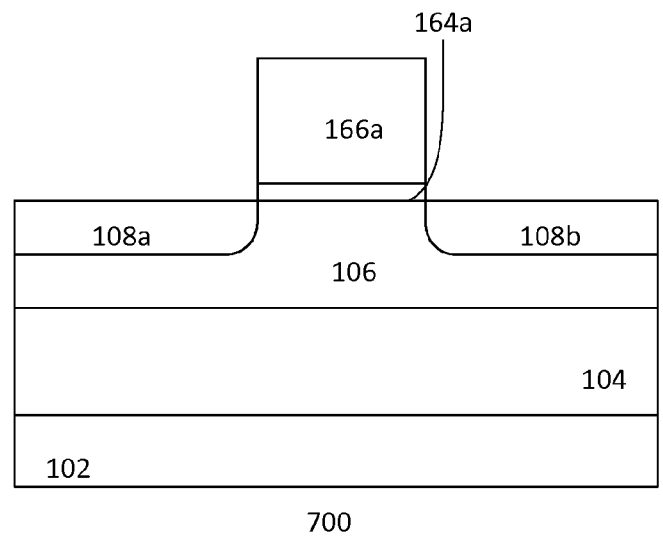

In one embodiment, the process continues to form first and second regions of first polarity type 108a/108b in the substrate adjacent to first and second sides of the patterned programmable resistive and electrode layers as shown in FIG. 7c. In one embodiment, to form the first and second regions 108a/108b, first polarity type dopants, such as n-type dopants, are implanted into the substrate. The implant, for example, may be self-aligned with respect to the patterned layers. Thus, implant mask to perform the implant is not required as the patterned layers may serve as the implant mask. For example, the implant may dope the substrate unprotected by the patterned layers and isolation region. The dopant concentration of the regions 108a/108b may be about 1E13-1E15 cm$^{-3}$. First polarity type dopants, such as n type dopants which include phosphorus (P), arsenic (As), or a combination thereof, are implanted at a dose of about 1E13-1E15 atoms/cm-2 and with energy of about 2-20 keV into the substrate to form the regions 108a/108b. Other suitable implant parameters may also be useful, depending on the depth of the region 106 and types of dopants. Lightly doped regions (not shown) may also be formed in the substrate adjacent to sides of the top electrode and to a depth above the depth of the regions 108a/108b. The lightly doped regions may be formed together when forming lightly doped regions in other device regions such as logic circuitry in the same substrate.

In an alternative embodiment, the second region 108b in the substrate adjacent to second side of the patterned programmable resistive and electrode layers as shown in FIG. 7c includes a heavily doped region. In this case, a separate implant may be performed on the second region 108b in the substrate. For example, an implant mask (not shown) which exposes the second region while covering the rest of the device region may be provided to perform the implant. The implant mask, for example, may be a photoresist layer. Other suitable types of implant masks may also be useful. The dopant concentration of the heavily doped second region 108b may be about 1E16-1E20 cm$^{-3}$. Other suitable dopant concentrations may also be useful.

Figure 7D:
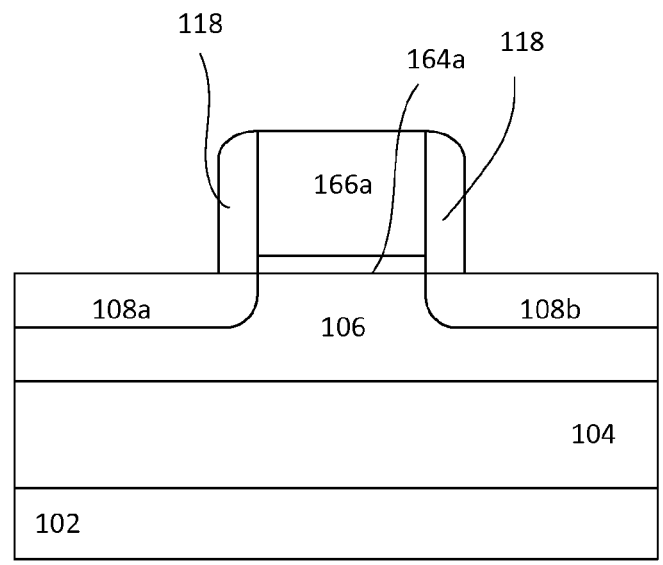

Sidewall spacers 118 may be formed over the first and second sidewalls of the patterned layers. To form the sidewall spacers, a spacer layer is deposited on the substrate. The spacer layer, for example, may be silicon nitride. Other suitable types of dielectric material, such as silicon oxide or silicon oxynitride may also be used. The spacer layer may be formed by CVD. The spacer layer may also be formed using other techniques. The thickness of the spacer layer may be about, for example, 5 nm. Other suitable thickness ranges may also be useful. The thickness, for example, may depend on the desired width of the spacers. An anisotropic etch, such as RIE, may be performed to remove horizontal portions of the spacer layer, leaving spacers 118 on the sidewalls as shown in FIG. 7d.

The steps illustrated with respect to FIGS. 7a-7d above are general steps performed for forming, for example, a CMOS structure. The process steps as described integrate a BJT-RRAM structure in CMOS processing. For example, in one embodiment, the first and second regions of first polarity type 108a/108b may be formed as part of the process for forming lightly doped first polarity type diffusion regions of other devices on the same substrate. In another embodiment, the heavily doped second region 108b may be formed as part of the process for forming heavily doped first polarity type diffusion regions of other devices on the same substrate.

Figure 7E:
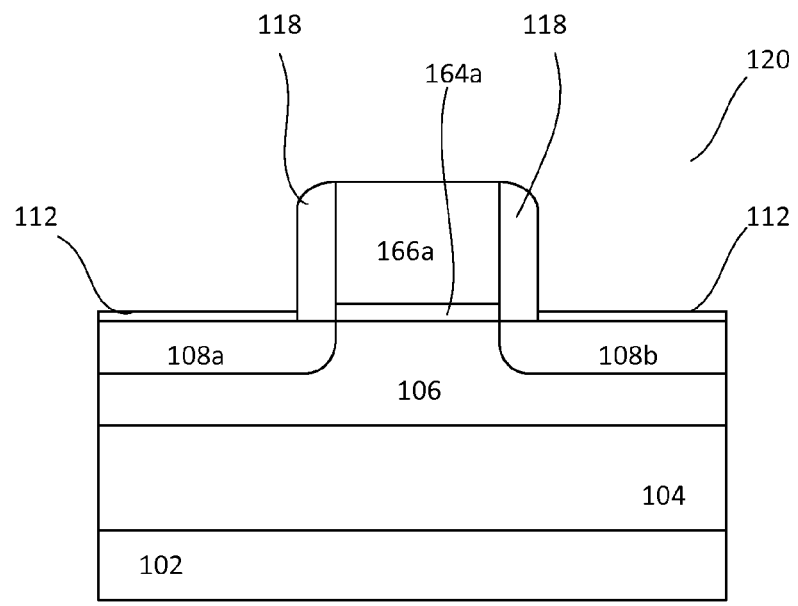

The process may continue to complete the memory cell. For example, silicide contacts 112 may be formed on the first and second regions of the first polarity type 108a/108b. The silicide contacts, for example, may be nickel-based metal silicide layers. Other suitable types of silicide contacts may also be useful. The silicide contacts facilitate reduced contact resistance. To form silicide contacts, a metal layer may be deposited over the substrate and annealed to cause a reaction with silicon. Unreacted metal is removed by, for example, a wet etch, leaving the silicide contacts on the first and second first polarity type doped regions 108a/108b as shown in FIG. 7e.

Figure 7F:
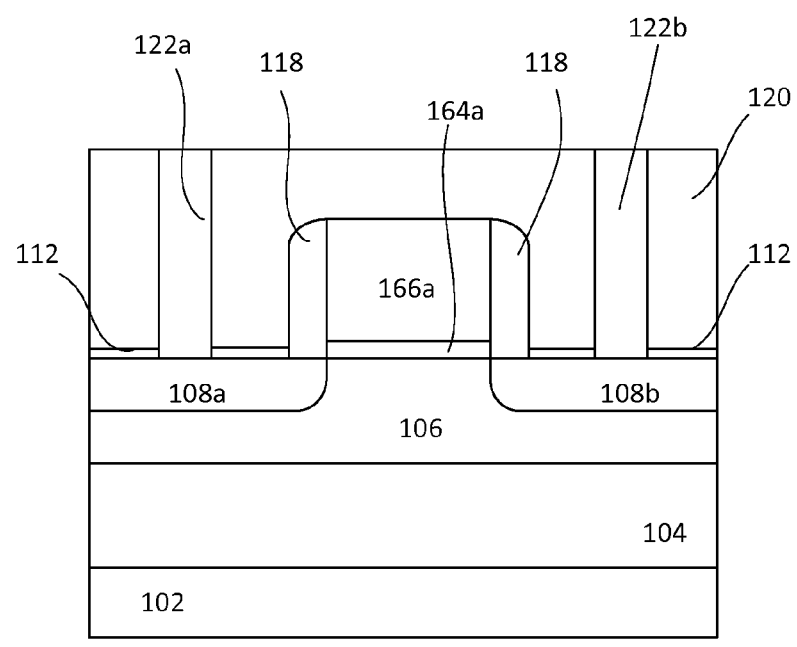

Referring to FIG. 7f, an interlevel dielectric (ILD) layer 120 is formed over the substrate. The ILD layer, for example, serves as a pre-metal dielectric (PMD) layer. The ILD layer, for example, is a silicon oxide layer. The ILD layer may be a high aspect ratio process (HARP) dielectric layer. Other suitable types of dielectric materials including BPSG, PSG, USG, TEOS oxide, PEOX, HDP oxide, etc., may also be useful. The ILD layer, for example, may be formed by CVD. Other suitable techniques may also be useful. A planarization process may be performed such that the top surface of the ILD layer is substantially planar or flat. For example, a chemical mechanical polishing (CMP) process may be employed. Other types of planarization processes may also be useful.

In one embodiment, the process may continue to form contacts which are coupled to contact regions of the substrate, followed by BEOL process. To form contacts 122a/122b, a soft mask (not shown) may be used to form via or contact openings to the contact regions. The soft mask, for example, is a photoresist mask. To improve lithographic resolution, an anti-reflective coating (ARC) may be provided between the PMD layer and soft mask. The soft mask is patterned to form openings corresponding to the contact regions. A conductive layer is then formed on the substrate, filling the openings and covering the ILD layer 120. A planarizing process, such as CMP, removes excess conductive layer, forming contacts 122a/122b having a substantially coplanar surface with the top surface of the ILD layer 120. Other techniques for forming contacts may also be useful.

As described, the first region of the first polarity type 108a serves as the collector, the second polarity type region 106 serves as the base while the second region of the first polarity type 108b serves as the emitter of the BJT. The first and second contacts 122a/122b are coupled to the respective first and second regions of the first polarity type 108a/108b. The first contact 122a couples the collector of the BJT to the bit line while the second contact 122b couples the emitter of the BJT to the source line. Contact to the electrode (not shown) or to the base of the BJT are formed at the end of the electrode. The contact to the electrode is a WL contact. As shown, the programmable resistive layer is directly disposed on the base of the BJT.

The process may continue to complete the memory cell. For example, BEOL process including interconnect metal levels may be provided to form interconnections to the terminals of the memory cell and other circuit components, as desired. Other processes may also be included to complete the memory cell or device, for example, final passivation, dicing and packaging.

The embodiment as described in FIGS. 7a-7f result in advantages. The embodiment as described in FIGS. 7a-7f forms a single-bit-per-cell structure. The embodiment as described enables the programmable resistive layer to be formed directly on the base of the BJT, of which the base of the BJT is part of a semiconductor substrate. Thus, the embodiment allows for a compact BJT-RRAM structure to be formed. Moreover, the process as described is compatible with CMOS technology. This avoids the investment of new tools and technology, providing a cost effective solution.

Figure 8A:
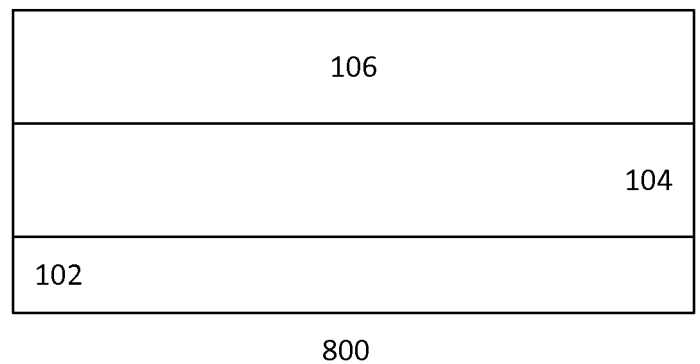
FIGS. 8a-8c show cross-sectional views of another embodiment of a process for forming a device.
Figure 8B:
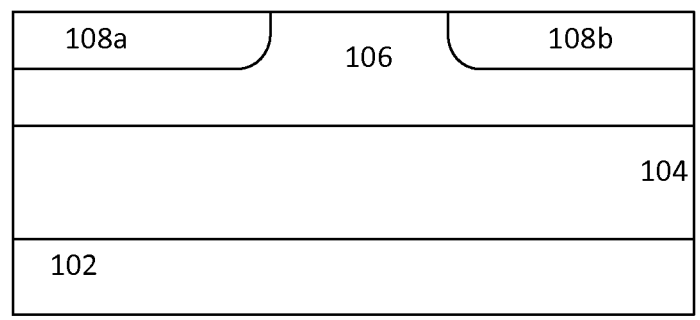
Figure 8C:
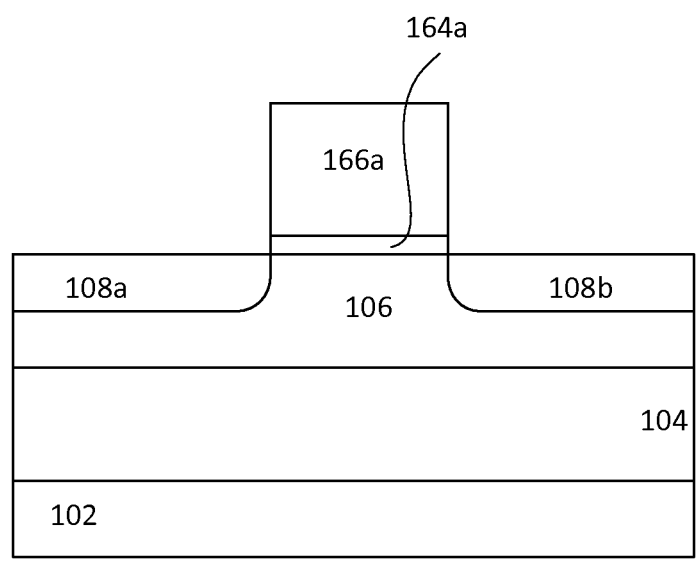

FIGS. 8a-8c show cross-sectional views of another embodiment of a process 800 for forming a device. In one embodiment, the process 800 forms the portion of the device 200a of FIG. 2a. The process may contain similar steps as that described in FIGS. 7a-7f. In the interest of brevity, common elements may not be described or described in detail. As shown in FIG. 8a, a partially processed substrate is provided. The partially processed substrate is at the same stage as that described in FIG. 7a. For example, the substrate is processed to form a first polarity well 104 and is processed up to the stage of forming a region of a second polarity type 106 over the first polarity well.

In one embodiment, the process continues to form first and second regions of the first polarity type 108a/108b after forming the region of the second polarity type 106 as shown in FIG. 8b. An implant mask (not shown) which exposes the device region while covering a portion of the region of the second polarity type may be provided to perform the implant. The implant mask, for example, may be a photoresist layer. Other suitable types of implant masks may also be useful. The parameters of the implant to form the first and second regions of the first polarity type 108a/108b may be the same as that described in FIG. 7c and therefore will not be described or described in detail. Other suitable implant parameters may also be employed.

Referring to FIG. 8c, the process continues to form programmable resistive and electrode layers. The materials and techniques for forming these layers are the same as that described in FIG. 7b. In this case, the first and second regions of the first polarity type 108a/108b, for example, may or may not be aligned with the first and second sides of the patterned programmable resistive and electrode. For example, portions of the patterned layers may overlap the first and second regions of the first polarity type.

The process may continue to complete the memory cell. For example, the process continues from FIGS. 7d to 7f until a device shown in FIG. 7f is formed. For instance, the process continues to form sidewall spacers, silicide contacts, PMD layer, contacts, etc. Additional processes may be performed, including forming one or more interconnect levels, final passivation, dicing, assembly and packaging. Techniques and materials of these features are the same as that already described in FIGS. 7d to 7f.

FIGS. 9a-9f show cross-sectional views of another embodiment of a process 900 for forming a device. In one embodiment, the process 900 forms the portion of the device 200b of FIG. 2b. The process may contain the same or similar steps as that described in FIGS. 7a-7f. In the interest of brevity, common elements may not be described or described in detail and the description below focuses on the differences between the process 900 and the process 700.

Figure 9A:
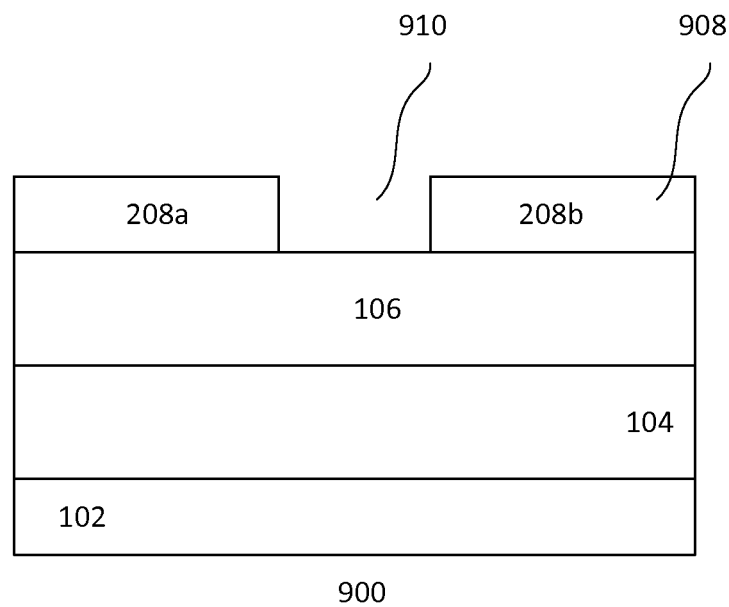
FIGS. 9a-9f show cross-sectional views of yet another embodiment of a process for forming a device.

Referring to FIG. 9a, a partially processed substrate is provided. For example, the substrate 102 is processed to form the well of the first polarity type 104 and is processed up to the stage of forming the region of the second polarity type 106 over the first polarity type well.

In one embodiment, the process continues to form an elevated layer of the first polarity type 908 over the second polarity type doped region 106 as shown in FIG. 9a. The elevated layer of the first polarity type 908 is formed by, for example, self-epitaxial growth (SEG) process. The epitaxial layer, in one embodiment, is in-situ doped with first polarity type dopants, such as n-type dopants. Doping the epitaxial layer with first polarity type dopants by ion implantation may also be useful. In one embodiment, the elevated layer of the first polarity type 908 may be formed as part of the process for forming first polarity type epitaxial raised source/drain (RSD) regions of other devices on the same substrate. The thickness of the elevated layer of the first polarity type 908, for example, is about 5-10 nm and the dopant concentration of the first polarity type is about 1E16-1E20 $cm^{-3}$ $cm^{-3}$. Other suitable thickness dimensions and concentrations may also be useful.

As shown in FIG. 9a, the process continues to forming an opening 910 through the elevated layer of the first polarity type 908. A mask (not shown) and etch process is employed to remove a portion of elevated layer of the first polarity type to form the opening 910. For example, the opening is formed by RIE. Other etch techniques may also be employed. The etch, for example, continues to remove the exposed portion of the elevated layer of the first polarity type until the top surface of the region of the second polarity type 106 is reached. As shown, first and second elevated layers of the first polarity type 208a/208b are separated by the opening. The opening also exposes a portion of the top surface of the second polarity type doped region 106.

Figure 9B:
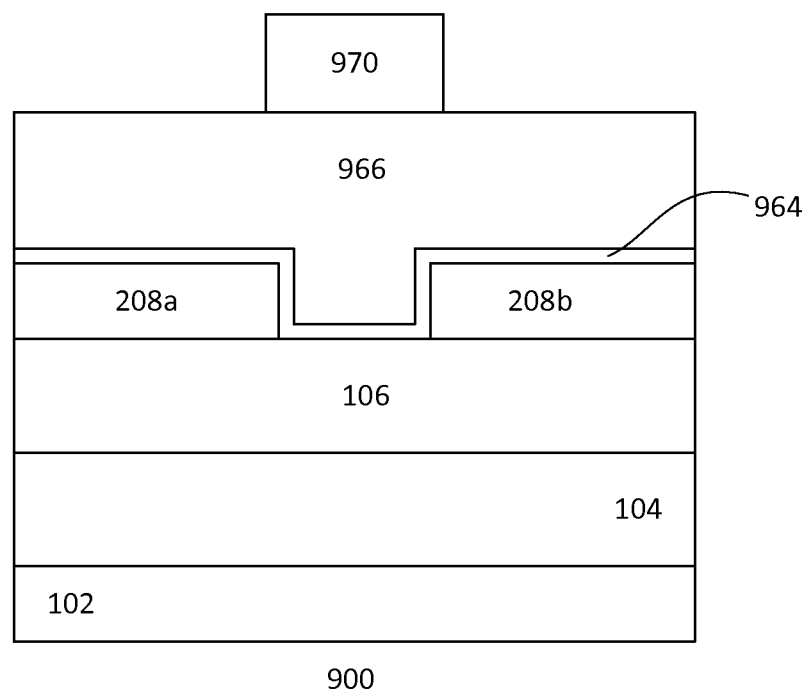

Referring to FIG. 9b, the process continues to form programmable resistive and electrode layers. The programmable resistive and electrode layers 964 and 966 are conformally formed on the substrate. For example, the programmable resistive layer 964 lines the top and exposed side surfaces adjacent to the opening of the first and second elevated layers of the first polarity type and the exposed portion of the second polarity type doped region while the electrode layer 966 covers the programmable resistive layer and fills the opening 910. Materials and techniques for forming the programmable resistive and electrode layers are the same as that described in FIG. 7b above.

Figure 9C:
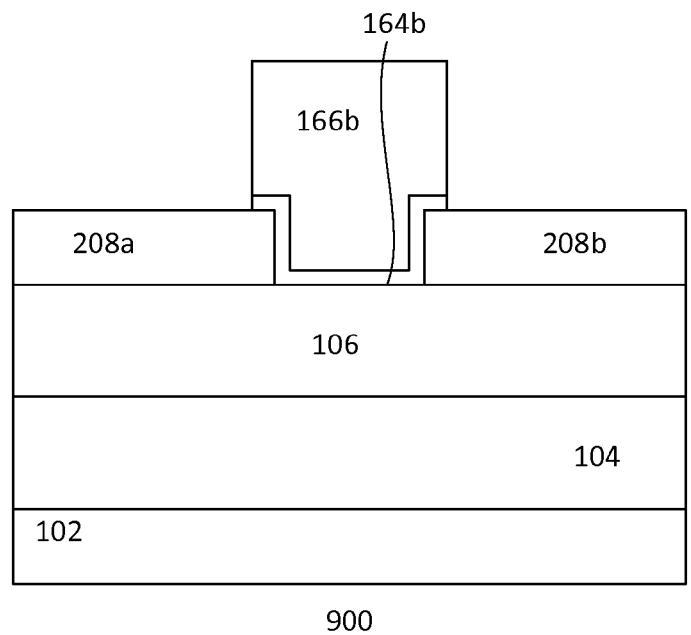

Referring to FIG. 9c, the layers are processed to form a patterned programmable resistive layer 164b and electrode 166b. The patterning of the layers can be achieved, for example, by mask and etch techniques. For example, a patterned photoresist mask 970 may be used as an etch mask for an anisotropic etch, such as a RIE. To improve lithographic resolution, an ARC can be provided beneath the photoresist. Other techniques for patterning the layers may also be useful. After patterning the layers, the mask, including the ARC layer, may be removed.

Figure 9D:
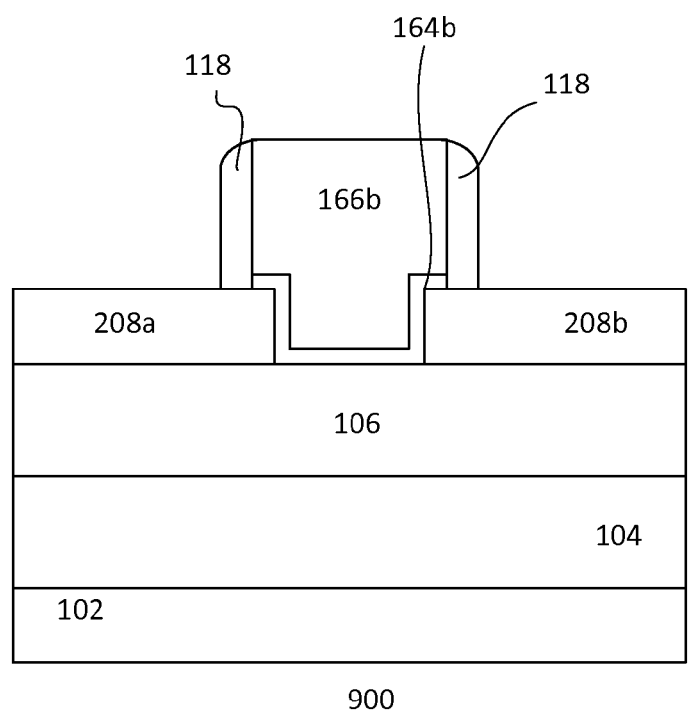

Sidewall spacers 118 may be formed over the first and second sidewalls of the patterned layers as shown in FIG. 9d. The material and technique for forming the sidewall spacers are the same as that described in FIG. 7d.

Figure 9E:
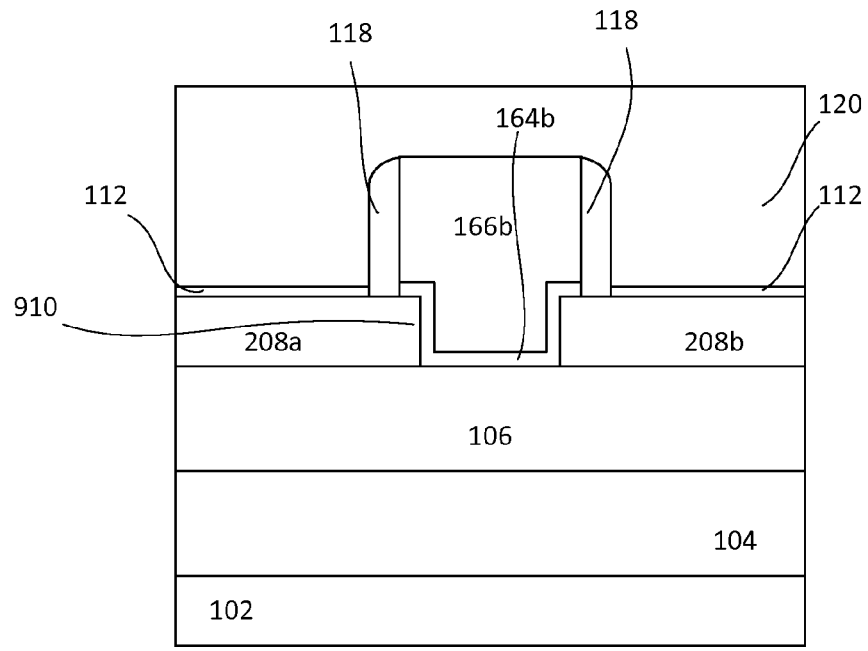
Figure 9F:
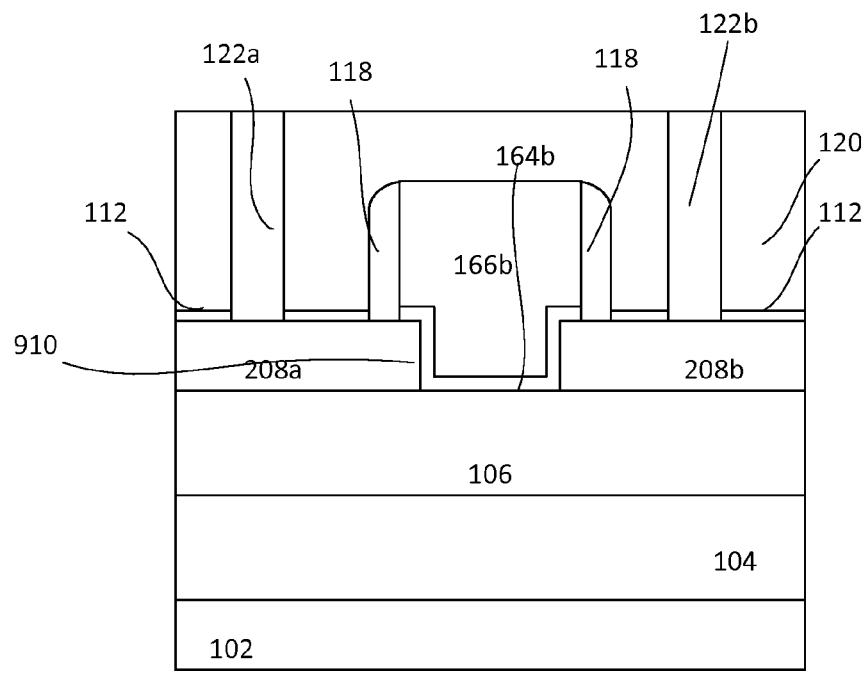

The process may continue to complete the memory cell. For example, silicide contacts 112 may be formed on the first and second elevated layers of first polarity type 208a/208b as shown in FIG. 9e. An interlevel dielectric (ILD) layer 120 is formed over the substrate. The ILD layer, for example, serves as a pre-metal dielectric (PMD) layer. The process may continue to form contacts 122a/122b which are coupled to contact regions such as the first and second elevated layers of the first polarity type as shown in FIG. 9f, followed by BEOL process. The materials and techniques for forming the silicide contacts, PMD layer and contacts are the same as that described in FIGS. 7e and 7f above.

The embodiment as described in FIGS. 9a-9f may have similar or the same advantages as the embodiment as described in FIGS. 7a-7f and 8a-8c above. Thus, similar or the same advantages will not be described.

FIGS. 10a-10h show cross-sectional views of yet another embodiment of a process 1000 for forming a device. In one embodiment, the process 1000 forms the portion of the device 500 of FIG. 5. In forming the device 500, the process 500 forms a two-bits-per-cell structure. The two-bits-per-cell structure includes first and second BJT-RRAM structures integrated with fin-type MOS processing. The process 1000 may contain similar steps as that described in FIGS. 7a-7f. In the interest of brevity, common elements may not be described or described in detail.

Figure 10A:
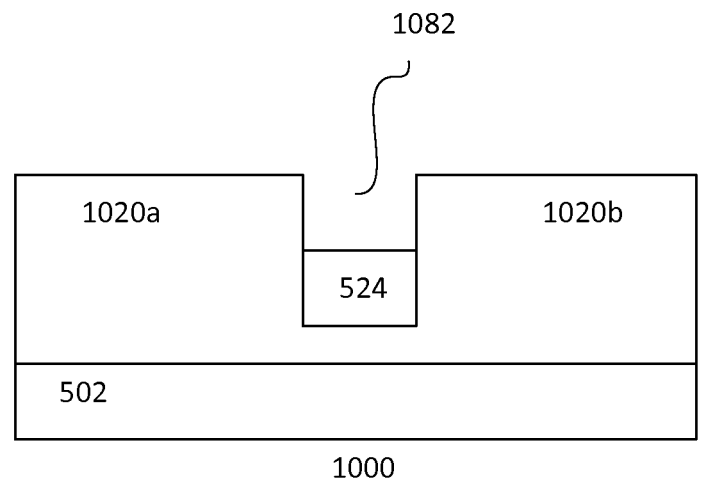
FIGS. 10a-10h show cross-sectional views of a further embodiment of a process for forming a device.

Referring to FIG. 10a, a substrate 502 is provided. The substrate 502 may include the same material as the substrate 102 described in FIG. 7a above. The substrate may be prepared with a device region. In one embodiment, the device region serves as a region for fin-type transistors. Although the substrate is described with one device region, it is understood that the substrate may include numerous device regions (not shown). The numerous device regions may include different types of device regions.

Referring to FIG. 10a, the substrate is processed to form a plurality of fin structures. For illustration purpose, the substrate is processed to form first and second fin structures 1020a/1020b. It is understood that the substrate may be processed to form more than two fin structures. The height of the fin, for example, may be about 50-100 nm. As for the width, it may be about 50-100 nm. Other suitable fin dimensions may also be useful.

Forming the fin structures 1020a/1020b may be achieved using various methods. The fin structures, for example, may be formed by patterning the substrate. For example, a patterned hard mask (not shown) is formed over the substrate. In one embodiment, a hard mask layer (not shown), such as silicon oxide or silicon nitride, is formed on the substrate 502. Other suitable types of materials which are selective to an isolation layer as will be described later may also be used as the hard mask layer. The hard mask layer may be formed by chemical vapor deposition (CVD). Other suitable types of hard mask or techniques for forming the hard mask may also be useful.

The hard mask layer is patterned to correspond to the shape of the fin structures. The patterning of the hard mask layer can be achieved by mask and etch techniques. For example, a patterned soft mask (not shown), such as photoresist, may be used as an etch mask to pattern the hard mask layer. The soft mask may be patterned by photolithography. To improve lithographic resolution, an ARC (not shown) may be provided beneath the photoresist. The pattern of the photoresist mask is transferred to the hard mask by, for example, an anisotropic etch, such as aRIE. The soft mask is removed. An anisotropic etch, such as a RIE, is performed to remove portions of the substrate surface unprotected by the hard mask, leaving fin structures 1020a/1020b as described above disposed on the top surface of the substrate. Other suitable methods may also be employed to form the fin structures. The hard mask (not shown), remains on the top surface of the fin.

The process continues to form the isolation layer or region 524. An isolation layer, such as a dielectric layer which includes a silicon oxide layer, is formed over the substrate covering the fin structures. Other suitable types of dielectric layer may also be useful. The isolation layer, for example, may be formed over the substrate using CVD or high aspect ratio process (HARP). Other techniques for forming the isolation layer may also be useful. In one embodiment, a polishing process, such as CMP is performed to planarize the isolation layer to the top surface of the hard mask over the fin structures. A removal process, such as selective to the isolation layer which includes oxide material, is performed to remove or recess portions of the oxide to form the isolation region 524 and a gap or opening 1082 between the fin structures as shown in FIG. 10a. The removal process may include dry etch, wet etch or a combination thereof. The isolation layer, for example, has a height or thickness sufficient to provide isolation from the substrate below. The thickness of the isolation layer, for example, may be about 10-20 nm. Other suitable thickness ranges may also be useful.

Figure 10B:
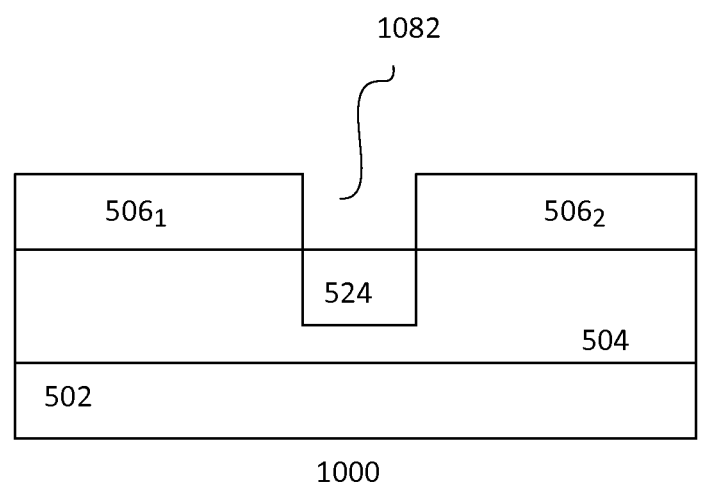

A well 504 is formed in the substrate as shown in FIG. 10b. The well, in one embodiment, includes first polarity type dopants. For example, first polarity type dopants are implanted into the substrate. A well implant mask may be used. The well implant mask may be the same mask used to form first polarity type wells in fin-type MOS processes. The well may be lightly or intermediately doped with first polarity type dopants. The well may be formed by ion implantation with dopant concentration of about 1E11-1E12 $cm^{-3}$ and includes a depth below the bottom of the isolation region 524.

In one embodiment, the process continues to form first and second regions of second polarity type $506_1/506_2$ in the fin structures 1020a/1020b as shown in FIG. 10b. The regions $506_1/506_2$ include lightly doped second polarity type dopants. To form the regions $506_1/506_2$, second polarity type dopants, such as p-type dopants, are implanted into the fin structures. The depth of the regions $506_1/506_2$, for example, may be about the height of the fin structures. Other suitable depth dimensions may also be useful, depending on technology node. The dopant concentration may be about 1E12-1E15 $cm^{-3}$. Other suitable dopant concentrations may also be useful. An implant mask which exposes the fin structures may be provided to perform the implant. The implant mask, for example, may be a photoresist layer. Other suitable types of implant masks may also be useful.

Figure 10C:
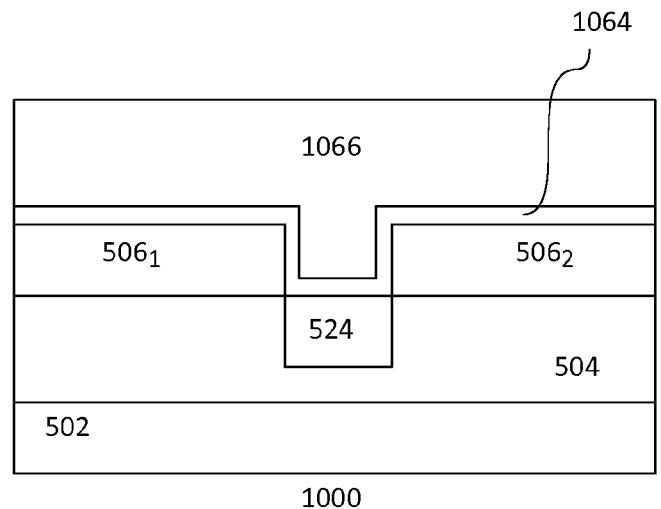

The process continues to form programmable resistive and electrode layers 1064 and 1066. As shown in FIG. 10c, the programmable resistive layer 1064 lines the top and exposed side surfaces adjacent to the opening of the first and second regions of the second polarity type and the exposed top surface of the isolation region while the electrode layer 1066 covers the programmable resistive layer and fills the opening 1082. Materials and techniques for forming the programmable resistive and electrode layers are the same as that described in FIG. 7b above.

Figure 10D:
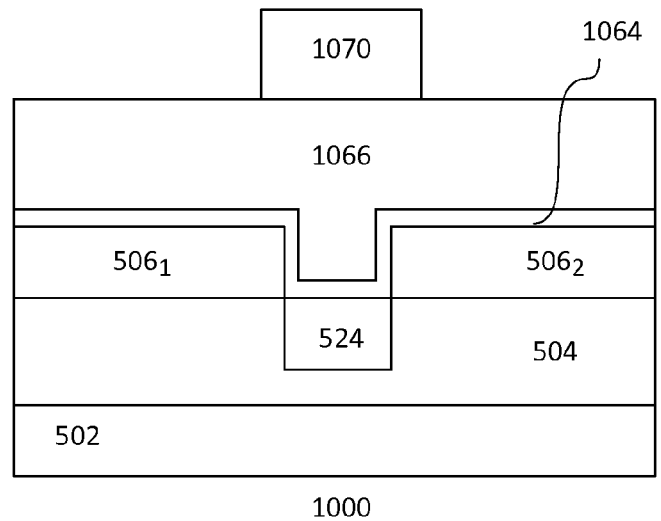
Figure 10E:
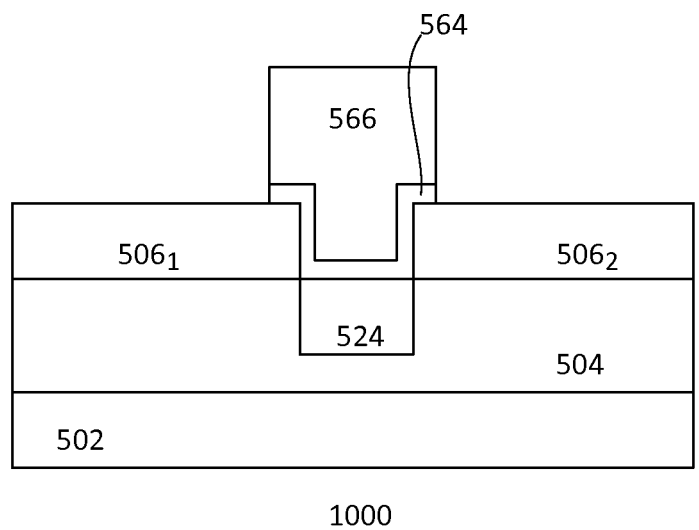

The process continues to form a patterned programmable resistive layer 564 and gate electrode 566. The patterning of the layers can be achieved, for example, by mask and etch techniques. For example, as shown in FIG. 10d, a patterned photoresist mask 1070 may be used as an etch mask for an anisotropic etch, such as a RIE. To improve lithographic resolution, an ARC can be provided beneath the photoresist. Other techniques for forming the patterned layers as shown in FIG. 10e may also be useful. After patterning the layers, the mask, including the ARC layer, may be removed. As shown in FIG. 10e, the patterned resistive layer 564 lines the opening and overlaps a portion of the regions of second polarity type $506_1/506_2$.

Figure 10F:
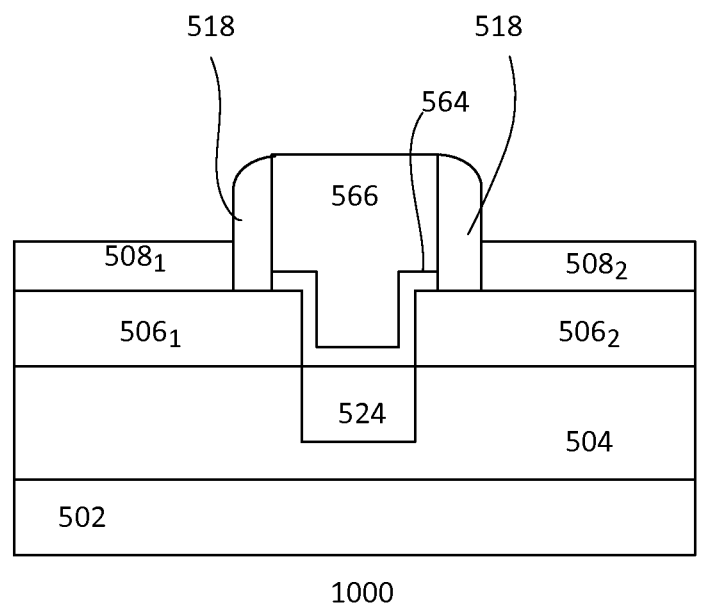

Sidewall spacers 518 may be formed over the first and second sidewalls of the patterned layers as shown in FIG. 10f. The material and technique for forming the sidewall spacers are the same as that described in FIG. 7d.

Referring to FIG. 10f, the process continues to form first and second elevated layers of first polarity type $508_1/508_2$ over the regions of second polarity type $506_1/506_2$ adjacent to first and second sides of the patterned layers. The first and second elevated layers $508_1/508_2$, for example, are heavily doped with first polarity type dopants. The first and second elevated layers of the first polarity type $508_1/508_2$ are formed by, for example, self-epitaxial growth (SEG) process. The epitaxial layers, in one embodiment, are in-situ doped with first polarity type dopants, such as n-type dopants. Doping the epitaxial layers with first polarity type dopants by ion implantation may also be useful. In one embodiment, the first and second elevated layers of the first polarity type $508_1/508_2$ may be formed as part of the process for forming first polarity type epitaxial raised source/drain (RSD) regions of other devices on the same substrate. The thickness of the first and second layers of the first polarity type $508_1/508_2$, for example, is about 5-10 nm and the dopant concentration of the first polarity type is about 1E16-1E20 $cm^{-3}$. Other suitable thickness dimensions and concentrations may also be useful.

Figure 10G:
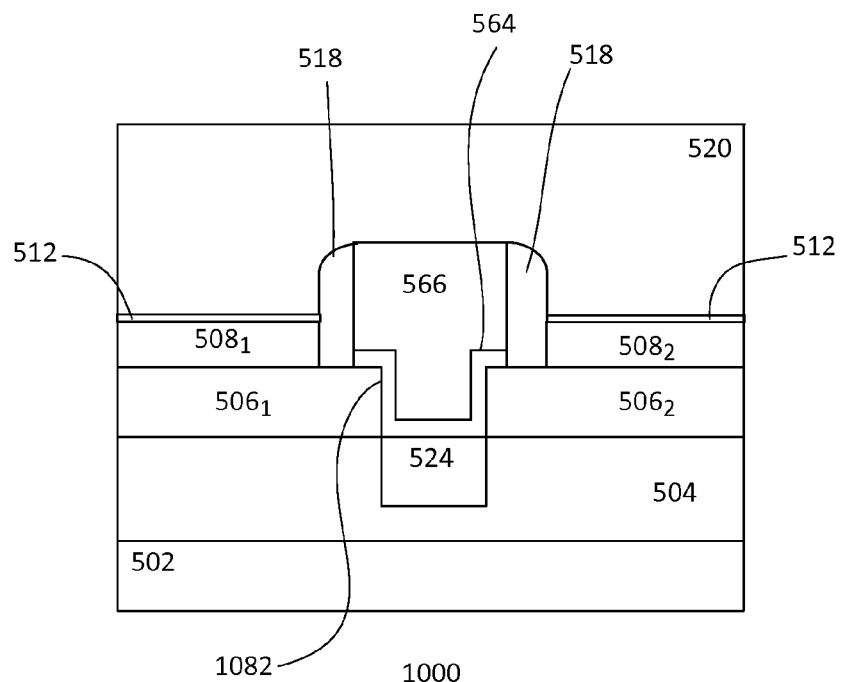
Figure 10H:
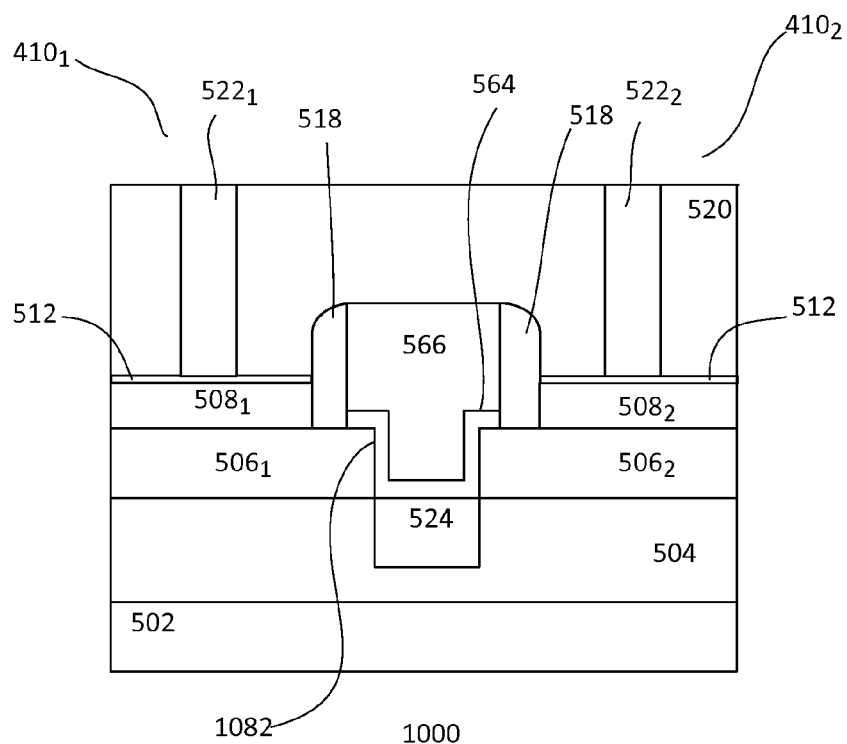

The process may continue to complete the memory cell. For example, silicide contacts 512 may be formed on the first and second elevated layers of first polarity type $508_1/508_2$ as shown in FIG. 10g. An interlevel dielectric (ILD) layer 520 is formed over the substrate. The ILD layer, for example, serves as a pre-metal dielectric (PMD) layer. The process may continue to form contacts $522_1/522_2$ which are coupled to contact regions such as the first and second elevated layers of the first polarity type, followed by BEOL process as shown in FIG. 10h. The materials and techniques for forming the silicide contacts, PMD layer and contacts are the same as that described in FIGS. 7e and 7f above.

The embodiment as described in FIGS. 10a-10h may have similar or the same advantages as the embodiment as described in FIGS. 7a-7f, 8a-8c and 9a-9f above. Thus, similar or the same advantages will not be described. In addition, the embodiment as described in FIGS. 10a-10h allows for two-bits-per-cell structure to be formed. For example, the embodiment as described in FIGS. 10a-10h allows for two different bits to be formed in a single cell structure. Further, the device also features self-aligned and compact elevated layers of first polarity type. This helps improve variation, achieve smaller cell size and lower manufacturing costs.

The present disclosure may be embodied in other specific forms without departing from the spirit or essential characteristics thereof. The foregoing embodiments, therefore, are to be considered in all respects illustrative rather than limiting the present disclosure described herein. Scope of the present disclosure is thus indicated by the appended claims, rather than by the foregoing description, and all changes that come within the meaning and range of equivalency of the claims are intended to be embraced therein.

What is claimed is:

1. A method of forming a device comprising:
providing a substrate with a device region for a memory cell, the device region includes a first doped region with second polarity type dopants;
forming first and second source/drain (S/D) regions in the device region over the first doped region, the first and second S/D regions are separated by a gate trench which exposes the first doped region, the first and second S/D regions comprise first polarity type dopants; and forming a gate in the device region, wherein the gate comprises a programmable resistive layer lining sides and a bottom of the gate trench and a gate electrode which fills the gate trench over the programmable resistive layer and extends above top surfaces of the first and second S/D regions, the programmable resistive layer is configured to serve as a storage layer of the memory cell.

2. The method of claim 1 wherein the memory cell comprises a 1-bit-per-cell structure, wherein:
the first doped region serves as a base terminal of a bipolar junction transistor (BJT) selector of the memory cell;
the first S/D region serves as a collector terminal of the BJT selector; and
the second S/D region serves as an emitter terminal of the BJT selector.

3. The method of claim 2, further comprising:
forming a source line coupled to the collector terminal of the BJT selector;
forming a bitline coupled to the emitter terminal of the BJT selector; and
forming a wordline coupled to the gate electrode of the gate.

4. The method of claim 2 wherein:
the first doped region extends from a surface of the substrate; and
forming the first and second S/D regions comprises forming an epitaxial S/D layer on the surface of the substrate over the first doped region and patterning the epitaxial S/D layer to form the first and second S/D regions with the gate trench therebetween.

5. The method of claim 2 wherein forming the comprises:
depositing a blanket programmable resistive layer which covers the first and second S/D regions and lines the sides and the bottom of the gate trench;
forming a blanket gate layer covering the first and second S/D regions and filling the gate trench; and
patterning the blanket programmable resistive layer and the blanket gate layer to form the gate.

6. The method of claim 2 wherein the substrate comprises a buried doped well disposed below the first doped region, the buried doped well comprises first polarity type dopants.

7. The method of claim 1 wherein the memory cell comprises a 2-bits-per-cell structure, the method further comprises:
after forming the gate, forming first and second gate sidewall spacers on first and second gate sidewalls;
forming first and second elevated epitaxial layers on the first and second S/D regions, the first and second elevated epitaxial layers comprise second polarity type dopants, the first elevated epitaxial layer is isolated from the first gate sidewall by the first gate sidewall spacer and the second elevated epitaxial layer is isolated from the second gate sidewall by the second gate sidewall spacer; wherein
the first elevated epitaxial layer serves as a first emitter of a first BJT selector of a first bit of the 2-bit memory cell structure;
the first S/D region serves as a first base of the first BJT selector;
the first doped region serves as a common collector for the first BJT selector and a second BJT selector of a second bit of the 2-bit memory cell structure;
the second elevated epitaxial layer serves as a second emitter of the second BJT selector; and
the second S/D region serves as a second base of the second BJT selector.

8. The method of claim 7 further comprising:
forming a source line coupled to the common collector of the first and second BJT selectors;
forming a first bitline coupled to the first emitter of the first BJT selector;
forming a second bitline coupled to the second emitter of the second BJT selector; and
forming a wordline coupled to the gate electrode of the gate.

9. The method of claim 7 further comprising forming an emitter isolation region under the gate trench, wherein the emitter isolation region extends from the bottom of the gate trench to a partial depth of the first doped region.

10. The method of claim 7 wherein the substrate comprises a buried doped well disposed below the first doped region, the buried doped well comprises first polarity type dopants.

11. The method of claim 7 wherein forming the gate further comprises:
depositing a blanket programmable resistive layer which covers the first and second S/D regions and lines the sides and the bottom of the gate trench;
forming a blanket gate layer covering the first and second S/D regions and filling the gate trench; and
patterning the blanket programmable resistive layer and the blanket gate layer to form the gate.

12. A method of forming a device comprising:
providing a substrate, the substrate comprises second polarity type dopants to form a second polarity type doped substrate; and
forming a memory cell comprising
forming a well in the substrate, the well comprises first polarity type dopants,
forming first and second first doped regions over the well, wherein forming the first and second first doped regions comprises
processing the substrate to form first and second fin structures on the substrate over the well and an opening separating the first and second fin structures, the opening exposes the well,
forming an isolation region in the substrate in the well between the fin structures, the isolation region having a top isolation region surface which is recessed below top fin structure surfaces of the first and second fin structures to provide a gate trench above the isolation region between the first and second fin structures, and
implanting second polarity type dopants into the first and second fin structures to form the first and second first doped regions of the second polarity type,
forming a patterned gate comprising
forming a programmable resistive layer on the substrate, the programmable resistive layer lines top, exposed sides of the first and second fin structures and a top of the isolation region, the programmable resistive layer serves as a storage layer of the memory cell,
forming an electrode layer on the substrate, the electrode layer covers the programmable resistive layer and fills the gate trench,
patterning the programmable resistive and electrode layers to form the patterned gate, wherein a first sidewall of the patterned gate is disposed on the first fin structure adjacent to the gate trench and a second sidewall of the patterned gate is disposed on the second fin structure adjacent to the gate trench, and wherein the first and second first doped regions contact the programmable resistive layer, and forming first and second elevated S/D regions adjacent to the first and second sidewalls of the patterned gate, the first and second elevated S/D regions comprises first polarity type dopants, and wherein a bottom of the first and second elevated S/D Regions and the first and second first doped regions form first p-n junctions, and a bottom of the first and second first doped regions and the well form second p-n junctions, wherein the first p-n junctions are disposed over the second p-n junctions.

13. The method of claim 12 wherein:

the first elevated S/D region serves as a first emitter of a first BJT selector of a first bit of a 2-bit memory cell structure;

the first first doped region serves as a first base of the first BJT selector;

the well serves as a common collector for the first BJT selector and a second BJT selector of a second bit of the 2-bit memory cell structure;

the second elevated S/D region serves as a second emitter of the second BJT selector; and the second first doped region serves as a second base of the second BJT selector.

14. The method of claim 13 further comprising:

forming a source line coupled to the common collector of the first and second BJT selectors;

forming a first bitline coupled to the first emitter of the first BJT selector;

forming a second bitline coupled to the second emitter of the second BJT selector; and forming a wordline coupled to the electrode layer of the patterned gate.

15. The method of claim 12 wherein forming the fin structures comprises:

forming a hard mask layer over the substrate; and patterning the hard mask layer to correspond to a shape of the fin structures.

16. The method of claim 15 wherein the hard mask layer is patterned by using a patterned soft mask as an etch mask.

17. The method of claim 12 wherein forming the isolation region comprises:

forming an isolation layer over the substrate covering the fin structures;

polishing the isolation layer to planarize the isolation layer to a top surface of the hard mask layer over the fin structures; and removing a portion of the isolation layer to form the isolation region, leaving the gate trench disposed above the isolation region.

18. A method of forming a device comprising:

providing a substrate, the substrate comprises second polarity type dopants to form a second polarity doped substrate; and forming a memory cell, the memory cell comprises a 2-bits-per-cell structure, and wherein forming the memory cell comprising forming a well in the substrate, the well comprises first polarity type dopants, forming a first doped region over the well, the first doped region comprises second polarity type dopants, the first doped region extends from a top surface of the substrate to a top surface of the well, processing the substrate to form first and second fin structures on the substrate over the well and an opening separating the first and second fin structures, the opening exposes the well, wherein the first and second fin structures comprise second polarity type dopants, forming an isolation region in the substrate in the well between the fin structures, wherein the well includes a depth below a bottom of the isolation region, forming a patterned gate on the substrate comprising forming a programmable resistive layer on the substrate, the programmable resistive layer serves as a storage layer of the memory cell and lines top and exposed sides of the first and second fin structures, and wherein the programmable resistive layer forms conduction paths when subjected to a forming procedure and breaks conduction paths when subjected to a reset procedure, forming an electrode layer on the substrate, the electrode layer covers the programmable resistive layer and fills the opening, and patterning the programmable resistive layer and electrode layer to form the patterned gate, wherein a first sidewall of the patterned gate is disposed on the first fin structure adjacent to the opening and a second sidewall of the patterned gate is disposed on the second fin structure adjacent to the opening, and forming first and second source/drain (S/D) regions comprises forming first and second elevated layers above a top surface of the first doped region and on the substrate over the first and second fin structures, the first and second S/D regions are adjacent to and extend outward from the first and second gate sidewalls, the first and second S/D regions comprise first polarity type dopants, and wherein the first doped region contacts the programmable resistive layer between the first and second elevated S/D regions.

19. A method of forming a device comprising:

providing a substrate; and forming a memory cell, wherein the memory cell comprises a 2-bits-per-cell structure, wherein forming the memory cell comprises forming a doped well of a first polarity type in the substrate, forming first and second doped regions of a second polarity type over the doped well, wherein forming the first and second doped regions over the doped well comprises processing the substrate to form first and second fin structures and an opening separating the first and second fin structures, the opening exposes the doped well, forming an isolation region between the fin structures, and implanting second polarity type dopants into the first and second fin structures to form the first and second doped regions of the second polarity type, and forming a patterned programmable resistive layer and electrode on the substrate, the programmable resistive layer serves as a storage layer of the memory cell, forming first and second S/D regions of the first polarity type on top of the first and second doped regions of the second polarity type and adjacent to the programmable resistive layer and electrode, and wherein
  the first and second doped regions contact the programmable resistive layer,
  a bottom of the first and second S/D regions and the first and second doped regions form first p-n junctions, and
  a bottom of the first and second doped regions and the well form second p-n junctions, wherein the first p-n junctions are disposed over the second p-n junctions.

20. The method of claim 19 wherein forming the first and second S/D regions of the first polarity type on top of the first and second doped regions comprises forming first and second elevated layers of the first polarity type over the first and second doped regions adjacent to first and second sides of the patterned programmable resistive layer and electrode.

\* \* \* \* \*